US008329569B2

(12) United States Patent
Li

(10) Patent No.: US 8,329,569 B2
(45) Date of Patent: Dec. 11, 2012

(54) DEPOSITION OF RUTHENIUM OR RUTHENIUM DIOXIDE

(75) Inventor: Dong Li, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 364 days.

(21) Appl. No.: 12/829,989

(22) Filed: Jul. 2, 2010

(65) Prior Publication Data

US 2011/0027977 A1  Feb. 3, 2011

Related U.S. Application Data

(60) Provisional application No. 61/230,454, filed on Jul. 31, 2009.

(51) Int. Cl.
*H01L 21/20* (2006.01)

(52) U.S. Cl. ........ 438/584; 438/627; 438/780; 257/750; 257/751; 257/762; 257/769; 257/E21.295

(58) Field of Classification Search .................. 438/584, 438/627, 780; 257/750–751, 762, 769, E21.242, 257/E21.295

See application file for complete search history.

(56) References Cited

U.S. PATENT DOCUMENTS

| | | | |
|---|---|---|---|
| 4,058,430 A | 11/1977 | Suntola et al. |
| 4,210,608 A | 7/1980 | Pinke |
| 4,477,296 A | 10/1984 | Nair |
| 4,604,118 A | 8/1986 | Bocko et al. |
| 4,670,110 A | 6/1987 | Withers et al. |
| 4,860,687 A | 8/1989 | Frijlink |
| 4,891,050 A | 1/1990 | Bowers et al. |
| 4,902,551 A | 2/1990 | Nakaso et al. |
| 4,965,656 A | 10/1990 | Koubuchi et al. |
| 5,106,454 A | 4/1992 | Allardyce et al. |
| 5,382,333 A | 1/1995 | Ando et al. |
| 5,391,517 A | 2/1995 | Gelatos et al. |
| 5,453,494 A | 9/1995 | Kirlin et al. |
| 5,637,533 A | 6/1997 | Choi |
| 5,695,810 A | 12/1997 | Dubin et al. |
| 5,711,811 A | 1/1998 | Suntola et al. |
| 5,731,634 A | 3/1998 | Matsuo et al. |

(Continued)

FOREIGN PATENT DOCUMENTS

DE  41 08 73  3/1925

(Continued)

OTHER PUBLICATIONS

U.S. Appl. No. 60/976,378, filed Sep. 28, 2007, Shinriki, H.

(Continued)

*Primary Examiner* — Evan Pert
*Assistant Examiner* — Mark A Laurenzi
(74) *Attorney, Agent, or Firm* — Knobbe, Martens, Olson & Bear, LLP

(57) ABSTRACT

Methods of forming ruthenium or ruthenium dioxide are provided. The methods may include using ruthenium tetraoxide ($RuO_4$) as a ruthenium precursor. In some embodiments for forming ruthenium, methods include forming a seed layer, and forming a ruthenium layer on the seed layer, using $RuO_4$. In other embodiments, methods include performing atomic layer deposition cycles, which include using $RuO_4$ and another ruthenium-containing co-precursor. In yet other embodiments, methods include adsorbing a reducing agent over a substrate, and supplying $RuO_4$ to be reduced to ruthenium by the adsorbed reducing agent. In other embodiments for forming ruthenium dioxide, methods may include providing an initial seed layer formed of, for example, an organic compound, and supplying $RuO_4$ over the seed layer.

33 Claims, 11 Drawing Sheets

U.S. PATENT DOCUMENTS

| | | |
|---|---|---|
| 5,820,664 A | 10/1998 | Gardiner et al. |
| 5,865,365 A | 2/1999 | Nishikawa et al. |
| 5,884,009 A | 3/1999 | Okase |
| 5,916,365 A | 6/1999 | Sherman et al. |
| 5,923,056 A | 7/1999 | Lee et al. |
| 5,939,334 A | 8/1999 | Nguyen et al. |
| 5,989,672 A | 11/1999 | Hayashi |
| 5,998,048 A | 12/1999 | Jin et al. |
| 6,006,763 A | 12/1999 | Mori et al. |
| 6,015,986 A | 1/2000 | Schuegraf |
| 6,033,584 A | 3/2000 | Ngo et al. |
| 6,040,243 A | 3/2000 | Li et al. |
| 6,063,705 A | 5/2000 | Vaartstra |
| 6,066,892 A | 5/2000 | Ding et al. |
| 6,074,945 A | 6/2000 | Vaartstra et al. |
| 6,108,937 A | 8/2000 | Raaijmakers |
| 6,124,189 A | 9/2000 | Watanabe et al. |
| 6,130,123 A | 10/2000 | Liang et al. |
| 6,133,159 A | 10/2000 | Vaartstra et al. |
| 6,136,163 A | 10/2000 | Cheung et al. |
| 6,139,700 A | 10/2000 | Kang et al. |
| 6,143,658 A | 11/2000 | Donnelly, Jr. et al. |
| 6,144,060 A | 11/2000 | Park et al. |
| 6,171,910 B1 | 1/2001 | Hobbs et al. |
| 6,203,613 B1 | 3/2001 | Gates et al. |
| 6,268,291 B1 | 7/2001 | Andricacos et al. |
| 6,270,572 B1 | 8/2001 | Kim et al. |
| 6,281,125 B1 | 8/2001 | Vaartstra et al. |
| 6,294,467 B1 | 9/2001 | Yokoyama et al. |
| 6,297,539 B1 | 10/2001 | Ma et al. |
| 6,303,500 B1 | 10/2001 | Jiang et al. |
| 6,305,314 B1 | 10/2001 | Sneh et al. |
| 6,306,756 B1 | 10/2001 | Hasunuma et al. |
| 6,320,213 B1 | 11/2001 | Kirlin et al. |
| 6,323,131 B1 | 11/2001 | Obeng et al. |
| 6,335,280 B1 | 1/2002 | Van der Jeugd |
| 6,342,277 B1 | 1/2002 | Sherman et al. |
| 6,346,151 B1 | 2/2002 | Jiang et al. |
| 6,359,159 B1 | 3/2002 | Welch et al. |
| 6,380,080 B2 | 4/2002 | Visokay |
| 6,391,785 B1 | 5/2002 | Satta et al. |
| 6,395,650 B1 | 5/2002 | Callegari et al. |
| 6,403,414 B2 | 6/2002 | Marsh |
| 6,404,191 B2 | 6/2002 | Daughton et al. |
| 6,420,189 B1 | 7/2002 | Lopatin |
| 6,433,432 B2 | 8/2002 | Shimizu |
| 6,444,568 B1 | 9/2002 | Sundararajan et al. |
| 6,444,868 B1 | 9/2002 | Vaughn et al. |
| 6,455,424 B1 | 9/2002 | McTeer et al. |
| 6,464,779 B1 | 10/2002 | Powell et al. |
| 6,475,276 B1 | 11/2002 | Elers et al. |
| 6,478,931 B1 | 11/2002 | Wadley et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,541,067 B1 | 4/2003 | Marsh et al. |
| 6,551,399 B1 | 4/2003 | Shen et al. |
| 6,576,053 B1 | 6/2003 | Kim et al. |
| 6,586,330 B1 | 7/2003 | Ludviksson et al. |
| 6,593,656 B2 | 7/2003 | Ahn et al. |
| 6,617,173 B1 | 9/2003 | Shen |
| 6,649,091 B2 | 11/2003 | Ryan et al. |
| 6,656,748 B2 | 12/2003 | Hall et al. |
| 6,664,192 B2 | 12/2003 | Satta et al. |
| 6,679,951 B2 | 1/2004 | Soininen et al. |
| 6,680,540 B2 | 1/2004 | Nakano et al. |
| 6,703,708 B2 | 3/2004 | Werkhoven et al. |
| 6,713,381 B2 | 3/2004 | Barr et al. |
| 6,720,262 B2 | 4/2004 | Koh et al. |
| 6,759,325 B2 | 7/2004 | Raaijmakers et al. |
| 6,777,331 B2 | 8/2004 | Nguyen |
| 6,784,101 B1 | 8/2004 | Yu et al. |
| 6,784,504 B2 | 8/2004 | Derderian et al. |
| 6,800,542 B2 | 10/2004 | Kim |
| 6,800,567 B2 | 10/2004 | Cho et al. |
| 6,824,816 B2 | 11/2004 | Aaltonen et al. |
| 6,842,740 B1 | 1/2005 | Jeran et al. |
| 6,849,122 B1 | 2/2005 | Fair |
| 6,852,635 B2 | 2/2005 | Satta et al. |
| 6,878,628 B2 | 4/2005 | Sophie et al. |
| 6,881,260 B2 | 4/2005 | Marsh et al. |
| 6,881,437 B2 | 4/2005 | Ivanov et al. |
| 6,887,795 B2 | 5/2005 | Soininen et al. |
| 6,921,712 B2 | 7/2005 | Soininen et al. |
| 6,933,225 B2 | 8/2005 | Werkhoven et al. |
| 6,936,535 B2 | 8/2005 | Kim et al. |
| 6,955,986 B2 | 10/2005 | Li |
| 6,984,591 B1 | 1/2006 | Buchanan et al. |
| 7,011,981 B2 | 3/2006 | Kim et al. |
| 7,067,407 B2 | 6/2006 | Kostamo et al. |
| 7,105,054 B2 | 9/2006 | Lindfors |
| 7,107,998 B2 | 9/2006 | Greer et al. |
| 7,118,779 B2 | 10/2006 | Verghese et al. |
| 7,135,207 B2 | 11/2006 | Min et al. |
| 7,183,604 B2 | 2/2007 | Cartier |
| 7,220,451 B2 | 5/2007 | Aaltonen et al. |
| 7,220,669 B2 | 5/2007 | Hujanen et al. |
| 7,241,677 B2 | 7/2007 | Soininen et al. |
| 7,256,144 B2 | 8/2007 | Koyanagi et al. |
| 7,273,526 B2 | 9/2007 | Shinriki et al. |
| 7,273,814 B2 | 9/2007 | Matsuda |
| 7,300,873 B2 | 11/2007 | Millward |
| 7,404,985 B2 | 7/2008 | Chang et al. |
| 7,419,903 B2 | 9/2008 | Haukka et al. |
| 7,435,484 B2 | 10/2008 | Shinriki et al. |
| 7,438,949 B2 | 10/2008 | Weidman |
| 7,476,618 B2 | 1/2009 | Kilpela et al. |
| 7,494,927 B2 | 2/2009 | Kostamo et al. |
| 7,541,284 B2 | 6/2009 | Park |
| 7,601,223 B2 | 10/2009 | Lindfors et al. |
| 7,615,480 B2 | 11/2009 | Boyd |
| 7,655,564 B2 | 2/2010 | Shinriki |
| 7,666,773 B2 | 2/2010 | Huotari et al. |
| 7,785,658 B2 | 8/2010 | Shinriki et al. |
| 7,799,674 B2 | 9/2010 | Shinriki et al. |
| 2001/0003064 A1 | 6/2001 | Ohto |
| 2001/0013617 A1 | 8/2001 | Toyoda et al. |
| 2001/0018266 A1 | 8/2001 | Jiang et al. |
| 2001/0030366 A1 | 10/2001 | Nakano et al. |
| 2001/0041250 A1 | 11/2001 | Werkhoven et al. |
| 2001/0052318 A1 | 12/2001 | Jiang et al. |
| 2002/0004293 A1 | 1/2002 | Soininen et al. |
| 2002/0006711 A1 | 1/2002 | Yamazaki et al. |
| 2002/0013487 A1 | 1/2002 | Norman et al. |
| 2002/0027286 A1 | 3/2002 | Sundararajan et al. |
| 2002/0173054 A1 | 11/2002 | Kim |
| 2003/0013302 A1 | 1/2003 | Nguyen et al. |
| 2003/0059535 A1 | 3/2003 | Luo et al. |
| 2003/0100162 A1 | 5/2003 | Joo |
| 2003/0121608 A1 | 7/2003 | Chen et al. |
| 2003/0135061 A1 | 7/2003 | Norman et al. |
| 2003/0165615 A1 | 9/2003 | Aaltonen et al. |
| 2003/0214043 A1 | 11/2003 | Saitoh et al. |
| 2003/0219991 A1 | 11/2003 | Geusic et al. |
| 2003/0233976 A1 | 12/2003 | Marsh et al. |
| 2004/0005753 A1 | 1/2004 | Kostamo et al. |
| 2004/0028952 A1 | 2/2004 | Cartier et al. |
| 2004/0038529 A1 | 2/2004 | Soininen et al. |
| 2004/0041194 A1 | 3/2004 | Marsh |
| 2004/0053496 A1 | 3/2004 | Choi |
| 2004/0082125 A1 | 4/2004 | Hou et al. |
| 2004/0087143 A1 | 5/2004 | Norman et al. |
| 2004/0105934 A1 | 6/2004 | Chang et al. |
| 2004/0118697 A1 | 6/2004 | Wen et al. |
| 2004/0126944 A1 | 7/2004 | Rotondaro et al. |
| 2004/0142558 A1 | 7/2004 | Granneman |
| 2004/0152255 A1 | 8/2004 | Seidl et al. |
| 2004/0192021 A1 | 9/2004 | Li |
| 2004/0192036 A1 | 9/2004 | Koyanagi et al. |
| 2004/0214354 A1 | 10/2004 | Marsh et al. |
| 2004/0224475 A1 | 11/2004 | Lee et al. |
| 2005/0009325 A1 | 1/2005 | Chung et al. |
| 2005/0020060 A1 | 1/2005 | Aaltonen et al. |
| 2005/0048794 A1 | 3/2005 | Brask et al. |

| | | |
|---|---|---|
| 2005/0082587 A1 | 4/2005 | Marsh |
| 2005/0085031 A1 | 4/2005 | Lopatin et al. |
| 2005/0087879 A1 | 4/2005 | Won et al. |
| 2005/0089632 A1 | 4/2005 | Vehkamaki et al. |
| 2005/0092247 A1 | 5/2005 | Schmidt et al. |
| 2005/0098440 A1 | 5/2005 | Kailasam et al. |
| 2005/0118807 A1 | 6/2005 | Kim et al. |
| 2005/0124154 A1 | 6/2005 | Park et al. |
| 2005/0181555 A1 | 8/2005 | Haukka et al. |
| 2005/0208754 A1 | 9/2005 | Kostamo et al. |
| 2005/0229848 A1 | 10/2005 | Shinriki et al. |
| 2005/0238808 A1 | 10/2005 | Gatineau et al. |
| 2005/0266700 A1 | 12/2005 | Jursich et al. |
| 2005/0271812 A1 | 12/2005 | Myo et al. |
| 2006/0013955 A1 | 1/2006 | Senzaki |
| 2006/0035462 A1 | 2/2006 | Millward |
| 2006/0073276 A1 | 4/2006 | Antonissen |
| 2006/0093848 A1 | 5/2006 | Senkevich et al. |
| 2006/0118968 A1 | 6/2006 | Johnston et al. |
| 2006/0128150 A1 | 6/2006 | Gandikota et al. |
| 2006/0137608 A1 | 6/2006 | Choi et al. |
| 2006/0165892 A1 | 7/2006 | Weidman |
| 2006/0177601 A1 | 8/2006 | Park et al. |
| 2006/0211228 A1 | 9/2006 | Matsuda |
| 2006/0216932 A1 | 9/2006 | Kumar et al. |
| 2006/0223300 A1 | 10/2006 | Simka et al. |
| 2006/0263977 A1 | 11/2006 | Kim et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0059502 A1 | 3/2007 | Wang et al. |
| 2007/0190782 A1 | 8/2007 | Park et al. |
| 2008/0038465 A1 | 2/2008 | Dussurrat |
| 2008/0124484 A1 | 5/2008 | Shinriki et al. |
| 2008/0146042 A1 | 6/2008 | Kostamo et al. |
| 2008/0171436 A1 | 7/2008 | Koh et al. |
| 2008/0200019 A9 | 8/2008 | Huotari et al. |
| 2008/0206982 A1 | 8/2008 | Suzuki |
| 2008/0206985 A1 | 8/2008 | Kim et al. |
| 2008/0214003 A1 | 9/2008 | Xia |
| 2008/0296768 A1 | 12/2008 | Chebiam |
| 2008/0315418 A1 | 12/2008 | Boyd |
| 2008/0318417 A1 | 12/2008 | Shinriki et al. |
| 2009/0068832 A1 | 3/2009 | Haukka et al. |
| 2009/0087339 A1 | 4/2009 | Shinriki |
| 2009/0104777 A1 | 4/2009 | Kim |
| 2009/0163024 A1 | 6/2009 | Kim et al. |
| 2010/0055433 A1 | 3/2010 | Shinriki et al. |

FOREIGN PATENT DOCUMENTS

| | | |
|---|---|---|
| EP | 0 469 456 | 7/1991 |
| EP | 0 469 470 A1 | 2/1992 |
| EP | 0 880 168 A2 | 11/1998 |
| EP | 1 688 923 A2 | 8/2006 |
| GB | 368850 | 12/1930 |
| GB | 1518243 | 7/1978 |
| GB | 2340508 A | 2/2000 |
| JP | 1998-340994 | 12/1998 |
| JP | 2003-168738 A | 6/2003 |
| KR | 10-2001-004717 | 1/2001 |
| KR | 10-2001-004718 | 1/2001 |
| KR | 10-2001-004719 | 1/2001 |
| KR | 10-2001-96408 | 11/2001 |
| KR | 10-2001-12889 | 12/2001 |
| KR | 10-2003-0011399 | 2/2003 |
| KR | 10-2005-0103373 | 10/2005 |
| WO | WO 93/10652 | 5/1993 |
| WO | WO 98/01890 | 1/1998 |
| WO | WO 99/17343 | 4/1999 |
| WO | WO 00/03420 | 1/2000 |
| WO | WO 00/38191 | 6/2000 |
| WO | WO 01/88972 | 5/2001 |
| WO | WO 01/50502 | 7/2001 |
| WO | WO 02/009126 | 7/2001 |
| WO | WO 02/009158 | 7/2001 |
| WO | WO 03/023835 | 3/2003 |
| WO | WO03/040150 | 5/2003 |
| WO | WO 03/056612 A1 | 7/2003 |
| WO | WO 2004/035858 | 4/2004 |
| WO | WO 2006/035281 | 4/2006 |

OTHER PUBLICATIONS

U.S. Appl. No. 61/178,871, filed May 15, 2009, Hamalainen et al.

Aaltonen et al. "Atomic Layer Deposition of Ruthenium Thin Films from Ru(thd)3 and Oxygen," Chem. Vap. Deposition, 10, (2004), pp. 215-219.

Aaltonen et al. "Reaction Mechanism Studies on Atomic Layer Deposition of Ruthenium and Platinum," Electrochem. Solid-State Lett., 6 (2003), C130-133.

Aaltonen et al., "ALD of Rhodium Thin Films from Rh (acac)$_3$ and Oxygen," Electrochem. Solid-State Lett. 8 (8): C99-C101 (2005).

Aaltonen et al., "Atomic Layer Deposition of Iridium Thin Films," J. Electrochem. Soc. 151(8): G489-G492 (2004).

Aaltonen et al., "Atomic Layer Deposition of Noble Metal Thin Films," dissertation presented at the University of Helsinki, Helsinki, Finland, 2005.

Aaltonen et al., "Atomic Layer Deposition of Noble Metals: Exploration of the Low Limit of the Deposition Temperature," J. Mat. Res. Soc. 19 (11): 3353-3358 (2004).

Aaltonen et al., "Atomic Layer Deposition of Platinum Thin Films," Chem. Mater. 15: 1924-1928 (2003).

Aaltonen et al., "Ruthenium Thin Film Grown by Atomic Layer Deposition," Chem. Vap. Deposition, 9[1], 45, 2003.

Ackerman et al., "Identifying Tunneling in Ferromagnetic-Insulator-Ferromagnetic Thin Film Structures," Journal of Magnetism and Magnetic Materials, vol. 240, Issues 1-3, pp. 86-91 (2002).

Addison et al., "The Vapour Pressure of Anhydrous Copper Nitrate, and its Molecular Weight in the Vapour State," J. Chem. Soc., pp. 3099-3106 (1958).

Aoyama et al., "Chemical Vapor Deposition of Ru and Its Application in (Ba, Sr) TiO$_3$ Capacitors for Future Dynamic Random Access Memories," Jpn. J. Appl. Phys. 38(43): 2194-2199 (1999).

Aoyama, Tomonori., et al., "Ruthenium Films Prepared by Liquid Source Chemical Vapor Deposition Using Bis-(ethylcyclopentadienyl)ruthenium". Jpn. J. Appl. Phys., vol. 38 (1999) pp. L1134-L1136.

Arnal et al., Materials and processes for high signal propagation performance and reliable 32 nm node BEOL., 1-4244-1069-X/07, 2007 IEEE, pp. 1-3.

Baklanov et al., "Characterization of Cu surface cleaning by hydrogen plasma," Journal Vac. Sci. Technol 19(4): 1201-1211 (2001).

Balgia, J., Associate Editor, "New designs and materials tackle 1 Gb memory challenges," Semiconductor International, World Wide Web address: semiconductor.net, Nov. 2000.

Basceri, C. Ph.D. thesis, "Electrical and Dielectric Properties of (BA,SR) TiO$_3$ Thin Film Capacitors for Ultra-High Density Dynamic Random Access Memories," 1997, pp. 13-31, Raleigh, N. C. State University.

Bobo et al., Spin Dependent Tunneling Junctions with Hard Magnetic Layer Pinning, Journal of Applied Physics, vol. 83. No. 11, pp. 6685-6687, (1998).

Bursky, "Hit Up IEDM for Gigabit and Denser DRAMs and Merged Logic/Memory," Electronic Design, World Wide Web address: planetee.com, Dec. 1, 1998.

Campbell et al., "Titanium dioxide (TiO2)-based gate insulators," IBM J. Res. Develop., May 1999, pp. 383-392, vol. 43, No. 3.

Daughton, World Wide Web, www.nve.com/Downloads/mram2.pdf "Advanced MRAM Concepts," Feb. 7, 2001, (last visited Oct. 12, 2010) 6 pages.

Fereday et al., "Anhydrous Cobalt (III) Nitrate," Chemical Communications, p. 271 (1968).

Fukuzumi et al., "Liner-Supported Cylinder (LSC) Technology to Realize Ru/Ta$_2$O$_5$/Ru Capacitor for Future DRAMs," IEEE, IED 2000, Session 34 (2000).

Fullerton et al, "Advanced Magnetic Recording Media for High-Density Data," Solid State Technology 44(i9): 87 (2001).

Hones et al., "MOCVD of Thin Ruthenium Oxide Films: Properties and Growth Kinetics," Chem. Vap. Deposition 6(4): 193-198 (2000).

Hoyas et al., Growth and characterization of atomic layer deposited WC0.7N0.3 on polymer films, Journal of Applied Physics, Jan. 1, 2004, vol. 95, Issue 1, pp. 381-388.

Hu et al., "In situ rapid thermal oxidation and reduction of copper thin films and their applications in ultralarge scale integration," Journal of the Electrochemical Society 148(12): G669-G675 (2001).

Hur'Yeva, Tetyana, et al., "Ruthenium Films Deposited by Liquid-Delivery MOCVD using Bis(ethylcyclopentadienyl)ruthenium with Toulene as the Solvent". Chemical Vapor Deposition 2006, 12, pp. 429-434.

Imai, Tajuki World Wide Web nikkeibp.asiabiztech.com/nea/200008/tech_108675.html, "100 Gbit/Inch HDD Just Around the Corner," p. 1-6, (Aug. 2000).

Inoue et al., "Low thermal-budget fabrication of sputtered-PZT capacitor on multilevel interconnects for embedded FeRAM," IEEE, IED 2000, 2000, Session 34.

Integrated Circuit Engineering Corporation, Practical Integrated Circuit Fabrication Seminar (1998).

Jung et al., "A Novel Ir/IrO$_2$/Pt-PZT-Pt/IrO$_2$/Ir Capacitor for a Highly Reliable Mega-Scale FRAM," IEEE, IED 2000, Session 34 (2000).

Kadota, Takumi et al., "Ruthenium Films Deposited under H2 by MOCVD using a Novel Liquid Precursor," Interconnect Technology Conference 2009, IITC 2009, IEEE International, pp. 175-176, Jun. 2009.

Kawaguchi, MPEG1 Decoder LSI for Video CD mPD61012NEC Device Technology International, NEC Device Technology International, New Products, Jan. 1998, vol. 5, Issue 48, pp. 4-8.

Kawamoto et al., "The Outlook for Semiconductor Processes and Manufacturing Technologies in the 0.1-µm Age," Hitachi Review 48(6): 334-339 (1999).

Kwon et al., "Ruthenium Bottom Electrode Prepared by Electroplating for a High Density DRAM Capacitor," J. Electrochem. Soc. 151(2): C127-C132 (2004).

Kwon et al., Plasma-enhanced atomic layer deposition of RuTiN thin films for the applicaiton of copper diffusion barrier, ALD Conference, 2004.

Kwon, et al., "Plasma-enhanced Atomic Layer Deposition of Ruthenium Thin Films", Electrochemical and Solid-State Letters, 7(4), C46-C48 (2004).

Lee et al., "Electroless CoWP boosts cooper reliability, device performance," Semiconductor International, Jul. 1, 2004, 5 pages.

Namba et al., PEALD of Ru layer on WNC ALD barrier for Cu/porous low-k, Proceedings of Advanced Metallization Conference 2006, p. 39.

NEC Device Technology International, "Current state of leading edge ULSI process technology and future trends," No. 48, pp. 4-8 (1998).

Nilsen et al. ,"Thin Film Deposition of Lanthanum Manganite Perovskite by the ALE process," Journal of Materials Chemistry, vol. 9, 1781-1784, (1999).

Onda et al., "Hydrogen plasma cleaning a novel process for IC-packaging," SEMICON WEST 97, Packaging Materials Conference, 1997, pp. D-1-D-10. (alternative source: p. 311, World Wide Web Address: Semiconductor Fabtech.com, 1998.).

Pakrad, "Pure Tech: Growth of MR/GMR Head Materials," World Wide Web, Puretechinc.com/tech_papers/tech_papers-4.htm, pp. 1-2, (1999).

Paranjpe et al., Atomic Layer Deposition of AlOx for thin Film Head Gap Applications, Journal of Electrochemical Society, vol. 148, Issue 9, G465-G471 (2001).

Park et al., "Metallorganic Chemical Vapor Deposition of Ru and RuO$_2$ using Ruthenocene Precursor and Oxygen Gas," J.Electrochem. Soc., 147[1], 203, 2000.

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

Ritala et al., "Atomic Layer Deposition," Handbook of Thin Film Materials vol. 1: Deposition and Processing of Thin Films, chapter 2, pp. 103-159 (2002).

Rossnagel, "The latest on Ru-Cu interconnect technology," Solid State Technology, Feb. 2005, Online, pp. 1-4.

Sakurai et al., "Adsorption of ruthenium tetroxide on metal surfaces," J. Phys. Chem. American Chemical Society, vol. 89, pp. 1892-1896 (1985).

Satta et al., "The Removal of Copper Oxides by Ethyl Alcohol Monitored in Situ by Spectroscopic Ellipsometry," Journal of the Electromechanical Society, 150 (5) , pp. 300-306 (2003).

Shao et al., An alternative low resistance MOL technology with electroplated rhodium as contact plugs for 32nm CMOS and beyond, 1-4244-1070-3/07, 2007 IEEE.

Singer, Peter, "Progress in Copper: A Look Ahead", Semiconductor International, May 1, 2002.

SOI Technology: IMB's Next Advance in Chip Design, 1998.

Solanki et al., "Atomic Layer Deposition of Copper Seed Layers," Electrochemical and Solid-State Letters 3(10): 479-480 (2000).

Sundani et al., "Oral Presentation of Dual Damascene Process," slides, Nov. 19, 1998.

Suntola, "Atomic Layer Epitaxy," Handbook of Crystal Growth, vol. 3, chapter 14, pp. 601-663 (1994).

Tung et al., Atomic Layer Deposition of Noble Metals: Exploration of the low limit of the deposition temperature, J. Mater. Res., vol. 19, No. 11, p. 3353-3357 (Nov. 2004).

Ueno et al. Cleaning of CHF3 plasma-etched SiO2/SiN/Cu via structures using a hydrogen plasma, an oxygen plasma and hexafluoracetylacetone vapors, J. Vac. Sci. Technology B vol. 16, No. 6, pp. 2986-2995 (1998).

Utriainen et al., "Studies of metallic thin film growth in an atomic layer epitaxy reactor using M(acac)$_2$ (M=Ni, Cu, Pt) precursors," Applied Surface Science 157: 151-158 (2000).

Utriainen et al., "Studies of NiO thin film formation by atomic layer epitaxy," Materials Science and Engineering B54: 98-103 (1998).

Wang, Shan X. "Advanced Materials for Extremely High Density Heads," www.iist.scu.edu/iist/events/wrkships/1999/II/Wang.pdf Magnetic Recording (last visited Oct. 12, 2010).

Winbond News Release, "Successful development of capacitor technology for next generation memory," World Wide Web address: winbond.com, Dec. 13, 2000.

Won et al., "Conformal CVD-ruthenium process for MIM capacitor in gigs-bit DRAMs," IEEE, IED 2000, Session 34 (2000).

World Wide web, magahaus.com/tech/westerndigital/shitepapers/gmr_wp.shtml, "GMR Head Technology: Increased Areal Density and Improved Performance Areal Density," pp. 1-4, (Feb. 2000).

World Wide Web, "Giant Magnetoresistive (GMR) Heads," pc.guide.com/ref/hdd/op/heads/techGMR-c.html, (last visited Oct. 12, 2010).

World Wide web, semiconductor.net/semiconductor/issues/Issues/1998/feb98/docs/emerging.asp, "GMR Read-Write Heads Yield Data Storage Record," pp. 1-2 (Feb. 1998).

World Wide Web, www.stoner.leeds.ac.uk/research/research%20topics, Magnetism and Magnetic Nanostructures (last visited Oct. 12, 2010).

Xu et al., "A breakthrough in low-k barrier/etch stop films for copper damascene applications," Semiconductor Fabtech, 2000, pp. 239-244, 11th Edition.

Yagishita et al., "Cleaning of Copper Surface Using Vapor-Phase Organic Acids," MRS Proceedings, vol. 766, MRS Spring 2003 Meeting, Apr. 21-25, 2003, Symposium E, Session E3, Paper E3.28.

Yang et al., Physical, Electrical, and Relaiability Characterization of Ru for Cu Interconnects, 2006 International Interconnect Technology Conference, pp. 187-190, ISBN 1-4244-0103-8/06, 2006 IEEE.

Yoon et al., "Development of an RTA process for the enhanced crystallization of amorphous silicon thin film," Electrochemical Society Proceedings 2000-9: 337-343 (2000).

Yoon et al., "Investigation of RuO$_2$-incorporated Pt layer as a Bottom Electrode and Diffusion Barrier for High Epsilon Capacitor Applications," Electrochemical and Solid-State Letters 3(8): 373-376 (2000).

Yoon et al., "Tantalum-ruthenium dioxide as a diffusion barrier between Pt bottom electrode and TiSi$_2$ ohmic contact layer for high density capacitors," Journal of Applied Physics 86(5): 2544-2549 (1999).

Yoon, Y.-G. et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division/Dielectric Science and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoong, T.-K. Kim, K.-B. Kim J.-Y. Chio, B.-I. Lee, and S.-K. Joo (Seoul National Univ.).

DEPOSITION OF RUTHENIUM OR RUTHENIUM DIOXIDE

CROSS-REFERENCE TO RELATED APPLICATIONS

This application claims the priority benefit under 35 U.S.C. §119(e) of U.S. Provisional Patent Application No. 61/230,454, filed on Jul. 31, 2009, the disclosure of which is incorporated herein by reference.

BACKGROUND OF THE INVENTION

1. Field

The invention relates to thin film deposition on a substrate. More particularly, the present invention relates to deposition of ruthenium or ruthenium dioxide.

2. Description of the Related Art

In manufacturing semiconductor devices, various processes have been developed to provide a high quality thin film on a substrate. Several methods have been used to form a thin film employing surface reactions on a semiconductor substrate. The methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE). ALE has been studied extensively for semiconductor deposition and electroluminescent display applications, and has been more recently referred to as Atomic Layer Deposition (ALD) for the deposition of a variety of materials.

Deposition processes continue to be developed as new needs and applications arise. For example, ruthenium or ruthenium dioxide have been found to have many desired properties, such as low resistivity, high thermal stability, ease of etching, and correct work functions. Thus, there is an on-going need to develop processes to deposit ruthenium or ruthenium dioxide for various applications.

SUMMARY OF THE INVENTION

According to one embodiment, a method of depositing a ruthenium layer over a substrate includes: supplying triruthenium dodecacarbonyl over a surface of a substrate to form a seed layer over the surface of the substrate; and conducting deposition over the seed layer, wherein the deposition comprises: supplying ruthenium tetraoxide over the seed layer.

According to another embodiment, a method for forming a ruthenium thin film on a substrate includes: loading a substrate into a reactor; and conducting a plurality of deposition cycles on the substrate. At least one of the cycles includes: supplying triruthenium dodecacarbonyl to the reactor during a first time period; and supplying ruthenium tetraoxide to the reactor during a second time period between the first time period and an immediately subsequent deposition cycle.

According to yet another embodiment, a method for forming a ruthenium thin film on a substrate includes: loading a substrate including a surface into a reactor; supplying a reducing agent to the reactor during a first time period such that at least a portion of the reducing agent is adsorbed on the surface of the substrate; supplying ruthenium tetraoxide to the reactor during a second time period after the first time period; and supplying a reducing agent to the reactor during a third time period after the second time period.

According to yet another embodiment, a method for forming a ruthenium dioxide thin film on a substrate includes: loading a substrate including a surface into a reactor; supplying an organic compound to the reactor during a first time period such that a layer of the organic compound is formed on the surface of the substrate; and supplying ruthenium tetraoxide to the reactor during a second time period after the first time period.

Other embodiments of the present invention will be readily apparent to those skilled in the art from the following detailed description of some embodiments and with reference to the attached figures, the invention not being limited to any of the particular embodiments disclosed.

BRIEF DESCRIPTION OF THE DRAWINGS

The invention will be better understood from the Detailed Description of Some Embodiments and from the appended drawings, which are meant to illustrate and not to limit the invention.

DETAILED DESCRIPTION OF SOME EMBODIMENTS

Figure 1A:
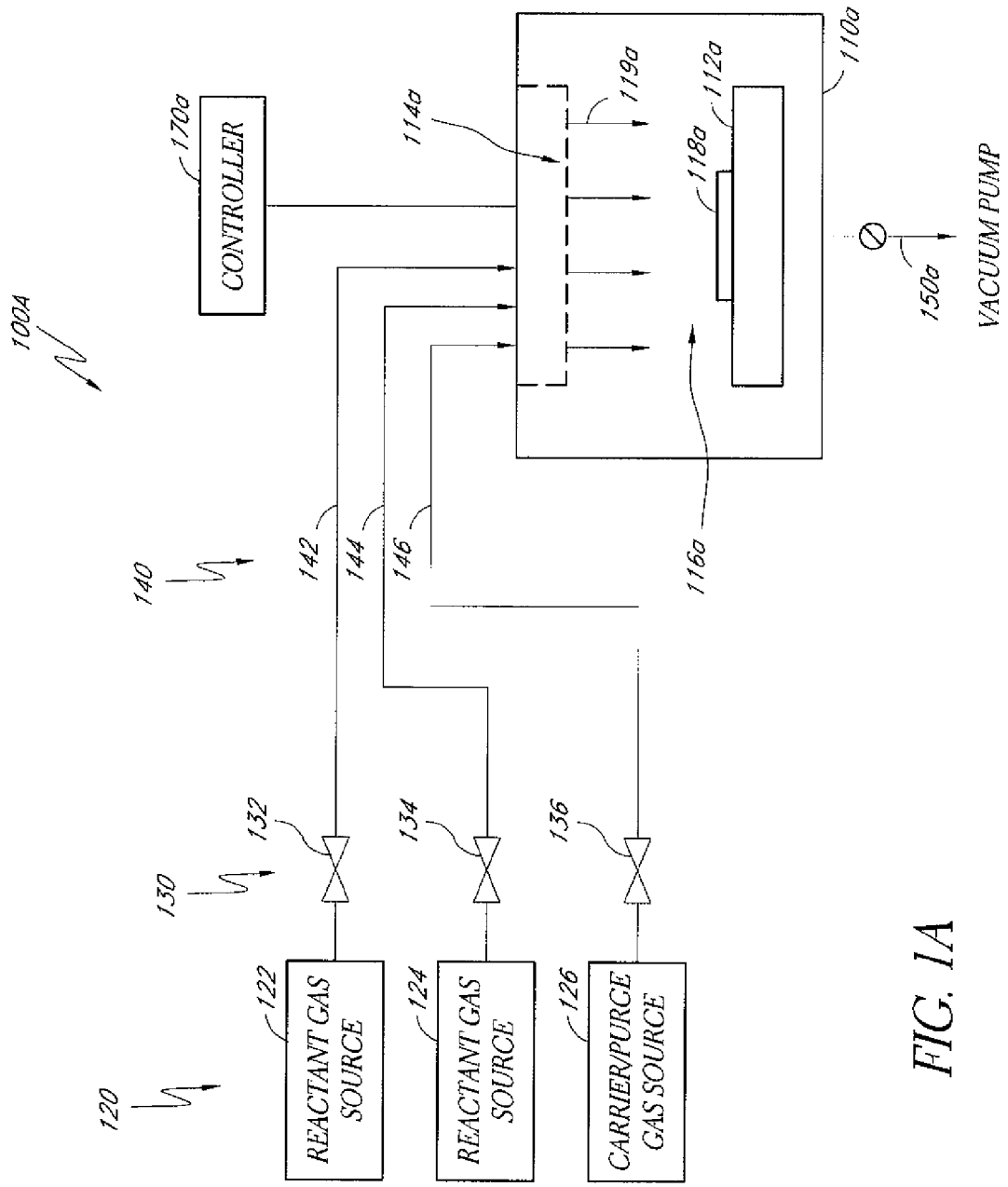
FIG. 1A is a schematic diagram of a deposition system including a reactor with a showerhead for depositing a ruthenium-containing layer according to one embodiment.

As described above, ruthenium and ruthenium dioxide have many desired properties, and thus have many possible applications. Thus, there is an on-going need for processes that can be used for controlled ruthenium or ruthenium dioxide deposition.

In certain instances, ruthenium tetraoxide ($RuO_4$) may be used as a precursor to deposit a ruthenium-containing layer. Such deposition may be conducted at a relatively high deposition rate at a temperature as low as room temperature.

However, when using $RuO_4$ as a precursor, a mixture of ruthenium (Ru) and ruthenium dioxide ($RuO_2$) is typically formed, and it has not been feasible to form either ruthenium or ruthenium dioxide individually. It is known that conversion of $RuO_4$ to Ru by hydrogen gas is thermodynamically more feasible than conversion of $RuO_2$ to Ru by hydrogen gas. The Gibbs Free Energies of the former ($RuO_4+4H_2 \rightarrow Ru+4H_2O$) and the latter ($RuO_2+2H_2 \rightarrow Ru+2H_2O$) are −745 KJ/mol and −251 KJ/mol, respectively. However, it is also known that ruthenium dioxide is autocatalytic, and thus may catalyze decomposition of $RuO_4$ to $RuO_2$. Once $RuO_4$ is at least partially decomposed to $RuO_2$, it is not feasible to further decompose the $RuO_2$ to Ru because $RuO_2$ is the most stable phase of ruthenium oxides.

In some embodiments, however, ruthenium tetraoxide ($RuO_4$) may still be used as a precursor for controlled deposition of either ruthenium (Ru) or ruthenium dioxide ($RuO_2$). In view of the above properties of $RuO_4$ and $RuO_2$, in embodiments where Ru is to be formed, it is desirable to reduce $RuO_4$ directly to Ru without forming $RuO_2$. Thus, in some embodiments described below, methods are provided to minimize or substantially prevent formation of $RuO_2$ when $RuO_4$ is used as a precursor. Alternatively, methods may be provided to at least slow down the initial decomposition of $RuO_4$ to $RuO_2$ so as to provide sufficient time for the conversion of $RuO_4$ to Ru before $RuO_2$ is formed in an amount that can be autocatalytic.

In contrast, in embodiments where $RuO_2$ is to be formed, methods are provided to facilitate formation of $RuO_2$ when $RuO_4$ is used as a precursor. Such methods provide conditions that favor the auto-catalytic decomposition of $RuO_4$ to $RuO_2$.

DEFINITIONS

In the context of this document, "a CVD process" generally refers to a process for producing a thin film over a substrate by gas-phase and/or surface reactions. In a CVD process, two or more reactants are supplied to a reactor simultaneously. The reactants react with one another in gas phase, and the resulting material is deposited on the substrate while by-products are produced.

In the context of this document, "an ALD process" generally refers to a process for producing thin films over a substrate molecular layer by molecular layer using self-saturating chemical reactions. The general principles of ALD are disclosed, e.g., in U.S. Pat. Nos. 4,058,430 and 5,711,811. In a typical ALD process, gaseous reactants are alternately and sequentially introduced into a reaction chamber (or reaction space) of an ALD type reactor where they contact a substrate located in the chamber to provide a surface reaction. The pressure and the temperature of the reaction chamber are adjusted to a range where physisorption (i.e., condensation of gases) and thermal decomposition of the precursors are avoided. In addition, reactants that do not react with themselves are selected. Consequently, only up to one monolayer (i.e., an atomic layer or a molecular layer) of material is deposited at a time during each pulsing cycle. The actual growth rate of the thin film, which is typically presented as Å/pulsing cycle, depends, for example, on the number of available reactive surface sites and the bulkiness of the reactant molecules. That is, once all available binding sites are filled, no additional surface reactions are possible. Gas phase reactions between precursors and any undesired reactions of by-products are inhibited because reactant pulses are separated from each other by time and the reaction chamber is purged with an inert gas (e.g., nitrogen, argon, or helium) and/or evacuated, e.g., using a vacuum pump, between reactant pulses to remove surplus (or excess) gaseous reactants and reaction by-products, if any.

"Reaction space" is used to designate a reactor or reaction chamber, or an arbitrarily defined volume therein, in which conditions can be adjusted to effect thin film growth over a substrate by ALD or CVD. Typically the reaction space includes surfaces subject to all reaction gas pulses from which gases or particles can flow to the substrate, by entrained flow or diffusion, during normal operation. The reaction space can be, for example, the reaction chamber in a single-wafer ALD or CVD reactor or the reaction chamber of a batch ALD or CVD reactor, where deposition on multiple substrates takes place at the same time. The reactor may be a reactor including a showerhead or a cross-flow reactor. The reactor is preferably configured for plasma generation, either in situ or remotely.

"Adsorption" is used to designate a physical and/or chemical attachment of atoms or molecules on a surface.

"Substrate" is used to designate any workpiece on which deposition is desired. Typical substrates can include, without limitation, silicon, silica, coated silicon, copper metal and nitride.

"Surface" is used to designate a boundary between the reaction space and a feature of the substrate.

"Thin film" means a film that is grown from elements or compounds that are transported as separate ions, atoms or molecules via vacuum, gaseous phase or liquid phase from the source to the substrate. The thickness of the film depends upon the application and may vary in a wide range, preferably from one atomic layer to 1,000 nm or more. In some embodiments, the thin film is less than about 20 nm in thickness, less than about 10 nm or less than about 5 nm.

Overview of Deposition Systems

In some embodiments, a process for depositing ruthenium or ruthenium dioxide can be carried out in a deposition system 100A shown in FIG. 1A. The illustrated system 100 includes a reactor 110a, gas sources 120, valves 130, gas supply lines 140, a gas exhaust line 150a, and a controller 170a.

The reactor 110a includes a substrate holder or susceptor 112a and a showerhead plate 114a. The substrate holder 112a, the showerhead plate 114a, and inner walls of the reactor 110a together define a reaction space 116a in which a substrate 118a is processed. The showerhead plate 114a is positioned over the substrate holder 112a with a plurality of openings facing the substrate holder 112a. The substrate holder 112a is configured to support the substrate 118a during a deposition process. In the illustrated embodiment, a substantially vertical flow 119a of gases is generated over the substrate 118a within the reaction space 116a by the showerhead plate 114a.

The gas sources 120 include a reactant gas source 122 for a first reactant, another reactant gas source 124 for a second reactant, and a gas source 126 for a purge and/or carrier gas. Each of the gas sources 122, 124, 126 is in fluid communication with the reactor 110a via a respective one of the gas supply lines 142, 144, 146. In addition, each of the gas supply lines 142, 144, 146 is provided with a valve 132, 134, or 136 for controlling the flow rate of the gas supplied to the reactor 110a.

The gas exhaust line 150a is configured to exhaust gases from the reactor 110a. In the illustrated embodiment, the gas exhaust line 150a is connected to a vacuum pump for facilitating exhausting gases from the reactor 110a.

The controller 170a controls the components of the deposition system 100A. For example, the controller 170a may be programmed to control the valves 130 to supply predetermined amounts of gases required for a deposition recipe in a timely manner. In some embodiments where the system 100A is used for CVD, the controller 170a may be set to deliver two or more reactants simultaneously to the reactor 110a. In other embodiments where the system 100A is used for ALD, the controller 170a may be set to deliver two or more reactants alternately or sequentially to the reactor 110a. In addition, the controller 170a may control the exhaust line 150a and the vacuum pump in a timely manner to regulate the exhaust of gases out of the reaction space 116a. The controller 170a may also control substrate loading/unloading operations for the reactor 110a. The controller 170a may be a general purpose computer or a customized microprocessor programmed to control various parts of the deposition system 100A. The controller 170a may also include other peripheral components such as a memory and a user interface. A skilled artisan will appreciate that various configurations of controllers can be used for the system 100A.

Figure 1B:
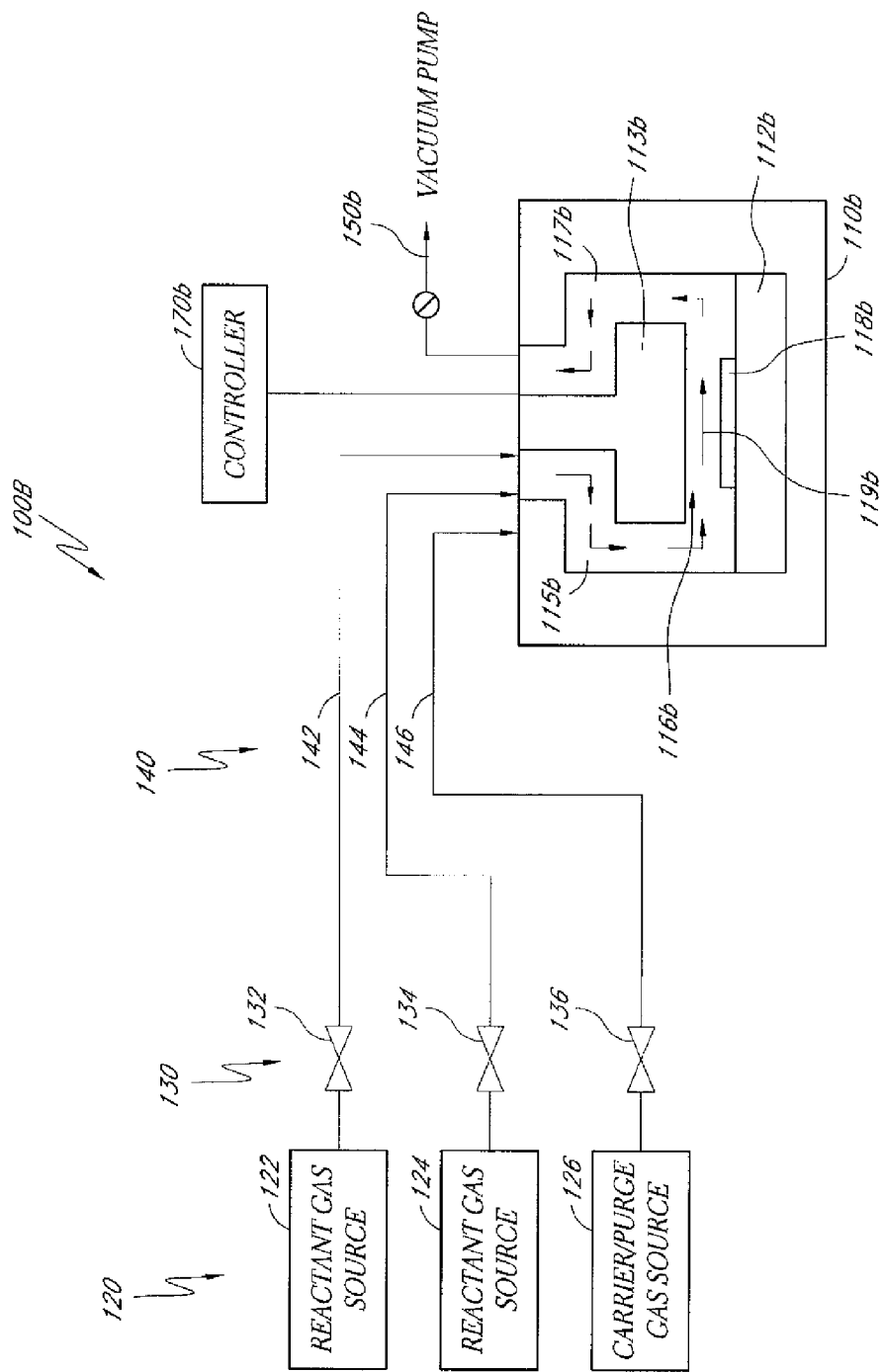
FIG. 1B is a schematic diagram of a deposition system including a cross-flow reactor for depositing a ruthenium-containing layer according to another embodiment.

In other embodiments, a process for depositing ruthenium or ruthenium dioxide can be carried out in a deposition system 10013 shown in FIG. 1B. The illustrated system 100 includes a reactor 110b, gas sources 120, valves 130, gas supply lines 140, a gas exhaust line 150b, and a controller 170b. The details of the gas sources 120, valves 130, gas supply lines 140 can be as described above with respect to those of FIG. 1A.

The reactor 110b may be a cross-flow reactor, and may include a substrate holder or susceptor 112b and a gas flow control plate 113b. The substrate holder 112b, the gas flow control plate 113b, and inner walls of the reactor 110b together define a reaction space 116b in which a substrate 118b is processed. The gas flow control plate 113b is positioned over the substrate holder 112b while defining inlet and outlet gas passages 115b, 117b leading to peripheries of the reaction space 116b. The substrate holder 112b is configured to support the substrate 118b during a deposition process. In the illustrated embodiment, a horizontal or laminar flow 119b of gases is generated over the substrate 118b within the reaction space 116b by the gas flow control plate 113b.

The gas exhaust line 150b is configured to exhaust gases from the reactor 110b. In the illustrated embodiment, the gas exhaust line 150b is connected to a vacuum pump for facilitating exhausting gases from the reactor 110b.

The controller 170b controls the components of the deposition system 100B. The details of the controller 170b can be as described above with respect to those of the controller 170a of FIG. 1A.

A skilled artisan will appreciate that various configurations of reactors can be adapted for deposition processes which will be described below. A skilled artisan will also appreciate that other types of deposition systems can be adapted for the deposition processes.

Deposition of Ruthenium

As described above, in some embodiments, methods for forming ruthenium from $RuO_4$ may include minimizing or preventing formation of $RuO_2$ or slowing down the initial decomposition of $RuO_4$ to $RuO_2$. In some embodiments, methods for forming ruthenium may include forming a ruthenium layer on a metallic surface. The method may include forming a seed layer, and forming a ruthenium layer on the seed layer, using $RuO_4$ by chemical vapor deposition (CVD) or atomic layer deposition (ALD). In other embodiments, methods include performing ALD cycles, at least one of which includes using $RuO_4$ and another Ru-containing co-precursor. In yet other embodiments, methods include adsorbing a reducing agent over a substrate, and supplying $RuO_4$ to be reduced to Ru by the adsorbed reducing agent. In certain embodiments, $RuO_4$ in a liquid form dissolved in a solvent may be supplied to a substrate to minimize decomposition of $RuO_4$ to $RuO_2$. Ruthenium layers resulting from the methods of the above embodiments may have a composition with a molar ratio of Ru to $RuO_2$ equal to or greater than about 200.

Deposition of Ru Using a Ru Seed Layer

In some embodiments, methods for forming ruthenium include forming a ruthenium (Ru) seed layer, using triruthenium dodecacarbonyl ($Ru_3(CO)_{12}$) as a precursor. Then, a ruthenium layer may be formed on the seed layer by chemical vapor deposition (CVD) or atomic layer deposition (ALD) using $RuO_4$ as a Ru precursor.

Figure 2A:
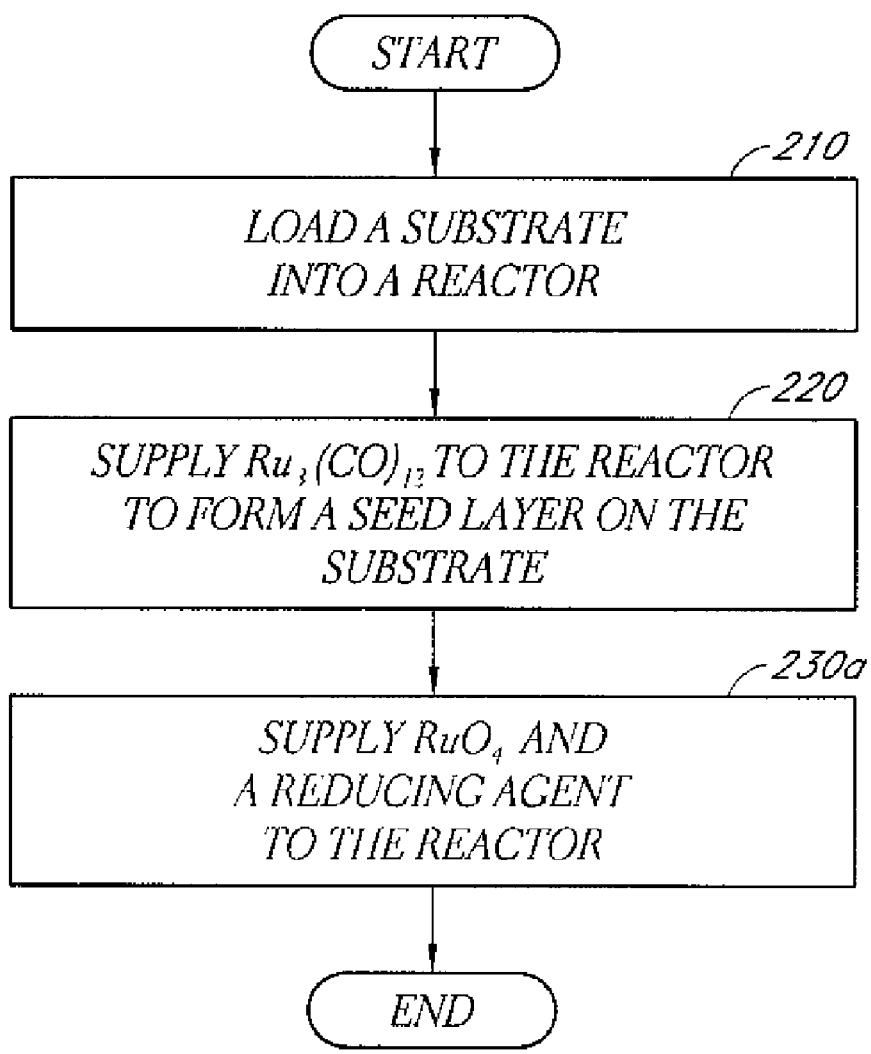
FIG. 2A is a flowchart illustrating a method of forming a ruthenium layer on a ruthenium seed layer by CVD according to one embodiment.

Referring to FIG. 2A, a method of depositing a ruthenium layer on a substrate according to one embodiment will be described below. At step 210, a substrate is loaded into a reactor. The reactor may be either of the reactors 110a, 110b shown in FIGS. 1A and 1B. A skilled artisan will recognize other suitable reactors that may be used for the method.

Subsequently, at step 220, a ruthenium seed layer is formed on at least a portion of the substrate. The ruthenium seed layer may be formed by supplying triruthenium dodecacarbonyl ($Ru_3(CO)_{12}$) gas to the reaction space of the reactor to contact the substrate such that a layer adsorbs on the substrate where the deposition is desired. In one embodiment, the triruthenium dodecacarbonyl gas may be supplied at a flow rate of about 1 sccm to about 200 sccm, and optionally about 10 sccm to about 50 sccm. The duration of the step 220 may be between about 0.5 seconds and about 10 seconds, and optionally between about 1 second and about 5 seconds. The temperature of the reactor may be maintained at about 150° C. to about 250° C., and optionally about 170° C. to about 200° C. during the step 220.

During the step 220, at least a portion of the triruthenium dodecacarbonyl gas is adsorbed on a surface of the substrate, and decomposes into ruthenium, thereby forming a monolayer or multiple layers of ruthenium. Such a layer may serve as a seed layer for ruthenium that is deposited thereon. The seed layer at least partly prevents formation of ruthenium dioxide ($RuO_2$) during subsequent deposition of ruthenium (Ru) using ruthenium tetraoxide ($RuO_4$).

At step 230a, a ruthenium layer may be formed on the seed layer by chemical vapor deposition (CVD). In the illustrated embodiment, ruthenium tetraoxide ($RuO_4$) and a reducing agent are simultaneously supplied to the reaction space of the reactor to contact the substrate. The term "reducing agent" generally refers to a compound that reduces another species in a reduction-oxidation reaction. The reducing agent may include, for example and without limitation, one or more of ammonia ($NH_3$), hydrogen gas ($H_2$), and hydrazine ($N_2H_4$).

In one embodiment, the ruthenium tetraoxide may be supplied at a flow rate of about 20 sccm to about 500 sccm, and optionally about 50 sccm to about 100 sccm. The reducing agent may be supplied at a flow rate of about 200 sccm to about 3000 sccm, and optionally about 500 sccm to about 1000 sccm. The duration of the step 230a can vary widely, depending on the thickness of the deposited ruthenium layer. The temperature of the reactor may be maintained at about 100° C. to about 250° C., and optionally about 150° C. to about 200° C.

Figure 2B:
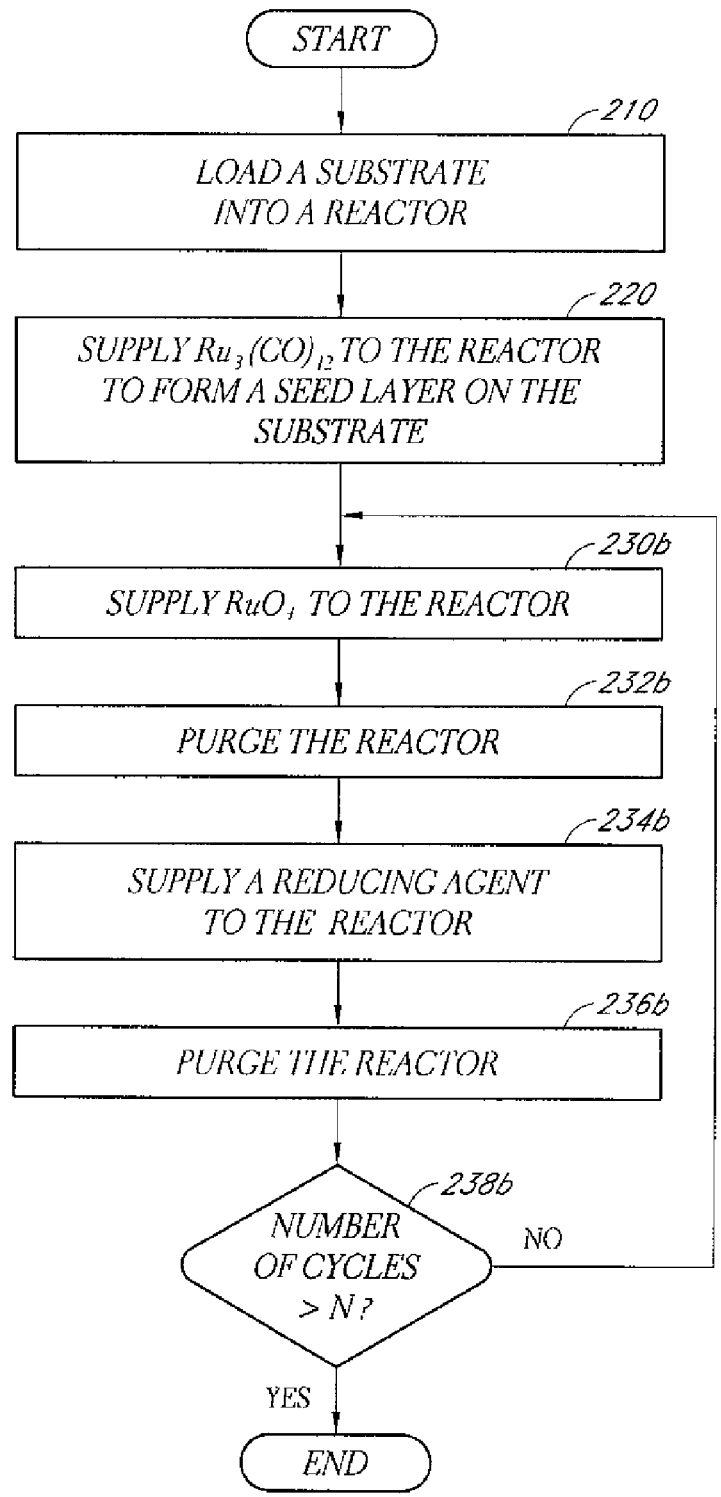
FIG. 2B is a flowchart illustrating a method of forming a ruthenium layer on a ruthenium seed layer by ALD according to another embodiment.

Referring to FIG. 2B, a method of depositing a ruthenium layer on a substrate according to another embodiment will be described below. At step 210, a substrate is loaded into a reactor. The reactor may be either of the reactors 110a, 110b shown in FIGS. 1A and 1B. A skilled artisan will appreciate that any other suitable reactor may be used for the method.

Subsequently, at step 220, a ruthenium-containing seed layer is formed over the substrate using $Ru_3(CO)_{12}$. Other details of the step 220 can be as described above with respect to the step 220 of FIG. 2A.

At steps 230b-236b, a ruthenium layer may be formed on the ruthenium seed layer by atomic layer deposition (ALD). In the illustrated embodiment, ruthenium tetraoxide ($RuO_4$)

and a reducing agent are alternately and sequentially supplied to the reaction space of the reactor to contact the substrate. The reducing agent may include, for example and without limitation, one or more of ammonia ($NH_3$), hydrogen gas ($H_2$), and hydrazine ($N_2H_4$). In one embodiment, the temperature of the reactor may be maintained at about 100° C. to about 250° C., and optionally about 150° C. to about 200° C.

At step 230b, a ruthenium tetraoxide gas pulse is supplied to the reaction space of the reactor to contact the substrate. In one embodiment, the ruthenium tetraoxide gas may be supplied at a flow rate of about 20 sccm to about 500 sccm, and optionally about 50 sccm to about 100 sccm. The duration of the step 230b may be between about 0.5 seconds and about 5 seconds, and optionally between about 1 second and about 3 seconds.

At step 232b, the reactor is purged to remove excess ruthenium tetraoxide gas and any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 232b may be between about 0.2 seconds and about 5 seconds, and optionally between about 0.5 seconds and about 2 seconds. In certain embodiments, the step 232b can be omitted.

At step 234b, a reducing agent gas pulse is supplied to the reaction space of the reactor to contact the substrate. In one embodiment, the reducing agent gas may be supplied at a flow rate of about 200 sccm to about 3000 sccm, and optionally about 500 sccm to about 1000 sccm. The duration of the step 234b may be between about 1 second and about 20 seconds, and optionally between about 3 seconds and about 7 seconds.

At step 236b, the reactor is purged to remove excess reducing agent and any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 236b may be between about 0.5 seconds and about 10 seconds, and optionally between about 2 seconds and about 5 seconds. In certain embodiments, the step 236b can be omitted.

The steps 230b-236b form a deposition cycle. In other embodiments, a deposition cycle may start with a step of supplying a reducing agent, which is followed by steps of supplying a purge gas, supplying $RuO_4$, and supplying a purge gas.

At step 238b, it is determined whether the number of deposition cycles is equal to a selected number N. The selected number N can be chosen, depending on the desired thickness of the film to be deposited by the method. If the number of deposition cycles is equal to the selected number N, the method is terminated. If not, the deposition cycle formed by the steps 230b-236b is further repeated.

Deposition of Ru by ALD Using $Ru_3(CO)_{12}$ and $RuO_4$

In other embodiments, methods for forming ruthenium may include performing ALD cycles, at least one of which includes alternately and sequentially contacting a substrate with $RuO_4$ and another Ru-containing co-precursor, such as triruthenium dodecacarbonyl ($Ru_3(CO)_{12}$). In certain embodiments, the methods may further include hydrogen gas pulse and purge steps to prevent the formation of ruthenium dioxide after each cycle or after completion of multiple cycles.

Figure 3A:
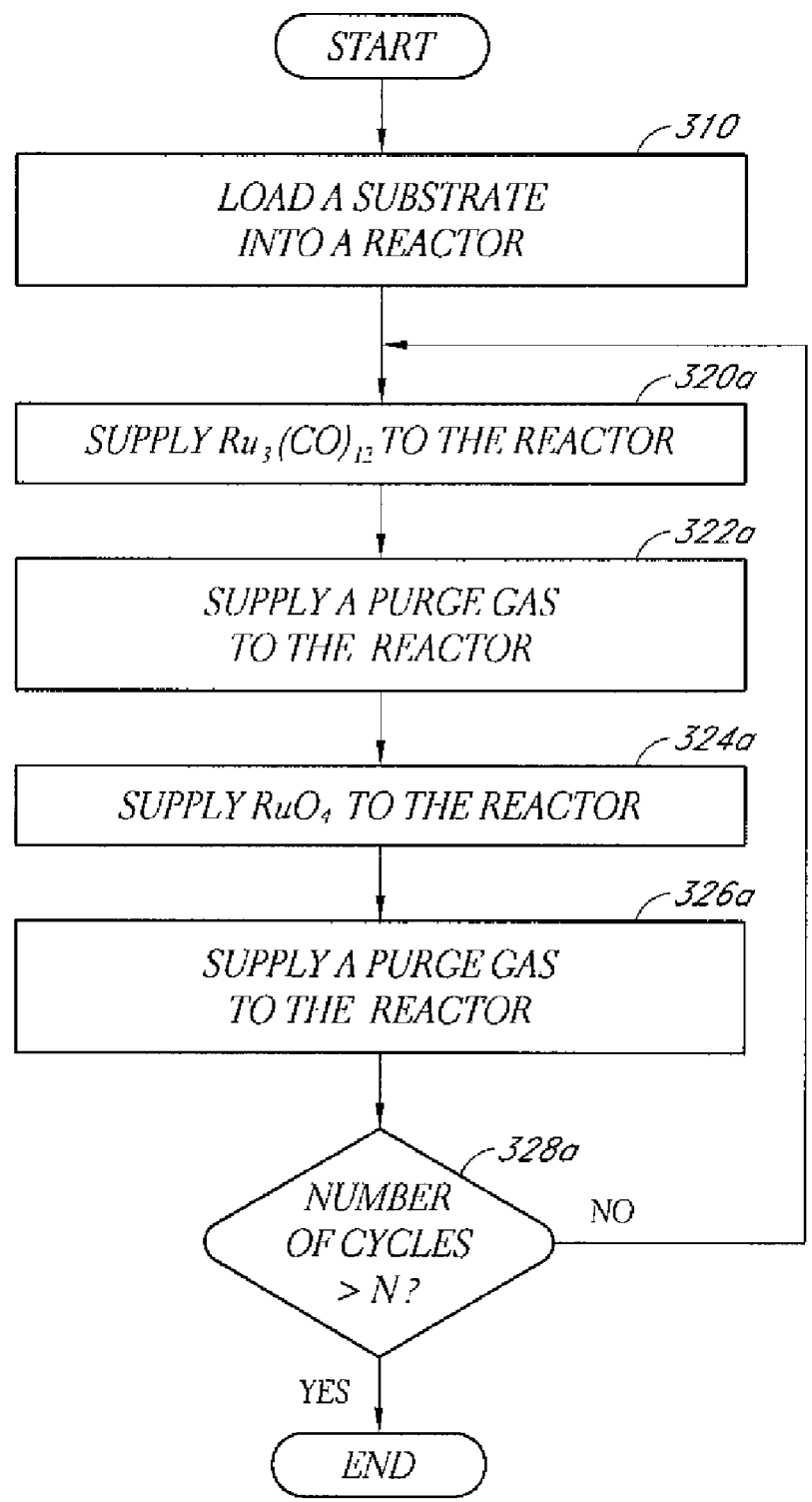
FIG. 3A is a flowchart illustrating a method of forming a ruthenium layer by ALD using ruthenium co-precursors according to yet another embodiment.

Referring, to FIG. 3A, a method of depositing a ruthenium layer on a substrate according to another embodiment will be described below. At step 310, a substrate is loaded into a reactor. The reactor may be either of the reactors 110a, 110b shown in FIGS. 1A and 1B. A skilled artisan will recognize other suitable reactors that may be used for the method.

Subsequently, at step 320a, a first ruthenium co-precursor pulse is supplied to the reaction space of the reactor to contact the substrate. In the illustrated embodiment, the first ruthenium co-precursor may be triruthenium dodecacarbonyl ($Ru_3(CO)_{12}$). In one embodiment, triruthenium dodecacarbonyl gas may be supplied at a flow rate of about 1 sccm to about 200 sccm, and optionally about 10 sccm to about 50 sccm. The duration of the step 320a may be between about 0.5 seconds and about 10 seconds, and optionally between about 1 second and about 5 seconds. At least a portion of the triruthenium dodecacarbonyl gas is adsorbed on a surface of the substrate, thereby forming at most a monolayer on the surface.

At step 322a, the reactor is purged to remove excess first ruthenium co-precursor and any by-products from the reactor. In one embodiment, an inert purge gas is supplied to the reactor to purge the reactor. Examples of inert purge gases include, but are not limited to, argon (Ar), helium (He), and nitrogen gas ($N_2$). The duration of the step 322a may be between about 0.5 seconds and about 10 seconds, and optionally between about 1 second and about 5 seconds. In certain embodiments, the step 322a can be omitted.

At step 324a, a second ruthenium co-precursor pulse is supplied to the reaction space of the reactor to contact the substrate. In the illustrated embodiment, the second ruthenium co-precursor may be ruthenium tetraoxide ($RuO_4$). In one embodiment, ruthenium tetraoxide gas may be supplied at a flow rate of about 20 sccm to about 500 sccm, and optionally about 50 sccm to about 100 sccm. The duration of the step 324a may be between about 0.5 seconds and about 5 seconds, and optionally between about 1 second and about 3 seconds. The ruthenium tetraoxide gas reacts, by a surface reaction, with triruthenium dodecacarbonyl adsorbed on the surface of the substrate, and forms a ruthenium layer while removing $CO_2$ as a by-product.

At step 326a, the reactor is purged to remove any excess second ruthenium co-precursor gas and any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 326a may be between about 0.2 seconds and about 5 seconds, and optionally between about 0.5 seconds and about 2 seconds. In certain embodiments, the step 326a can be omitted.

The steps 320a-326a form a deposition cycle. In other embodiments, a deposition cycle may start with a step of supplying $RuO_4$, which is followed by steps of supplying a purge gas, supplying $Ru_3(CO)_{12}$, and supplying a purge gas. During the deposition cycle, the temperature of the reactor may be maintained at about 100° C. to about 250° C., and optionally about 150° C. to about 200° C.

At step 328a, it is determined whether the number of deposition cycles is equal to a selected number N. The selected number N can be chosen, depending on the desired thickness of the film to be deposited by the method. If the number of deposition cycles is equal to the selected number N, the method is terminated. If not, the deposition cycle formed by the steps 320a-326a is further repeated.

Figure 3B:
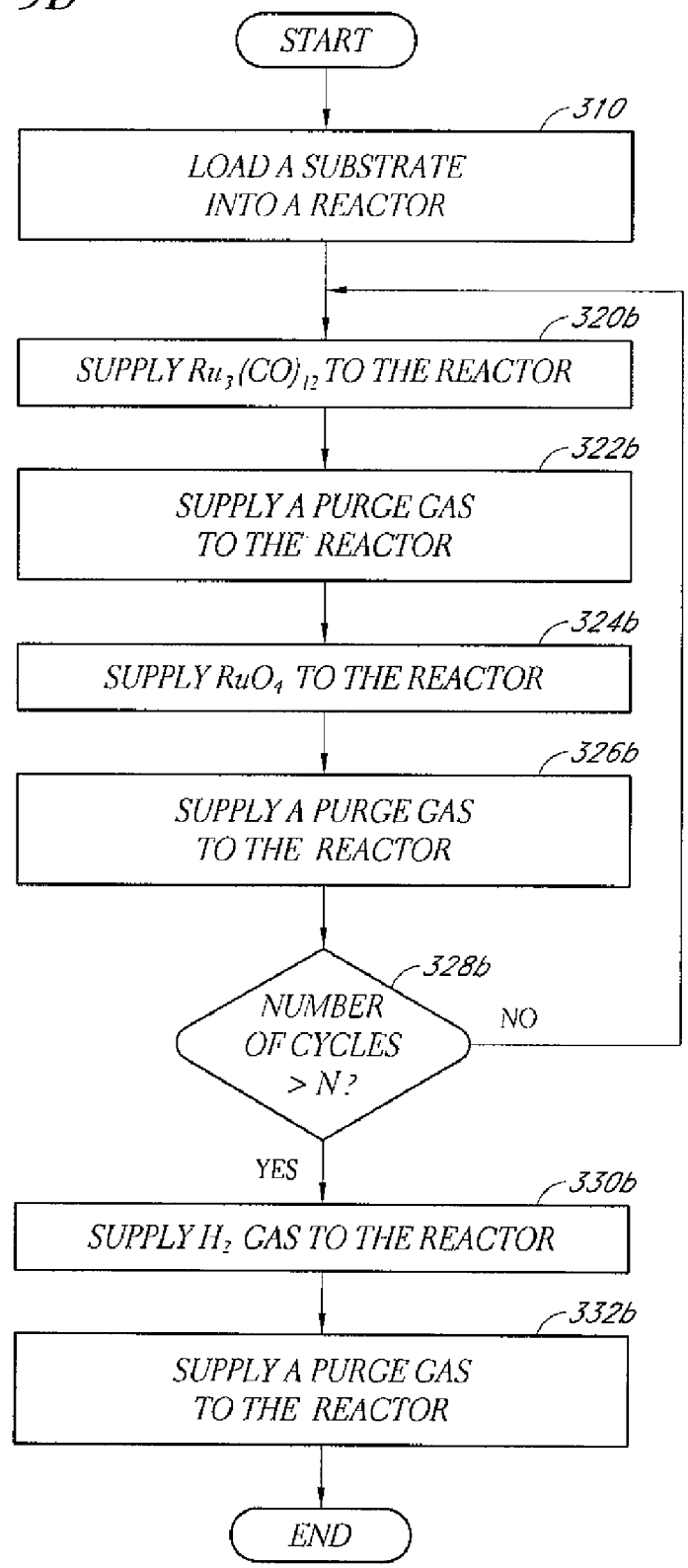
FIG. 3B is a flowchart illustrating a method of fanning a ruthenium layer by ALD using ruthenium co-precursors according to yet another embodiment.

Referring to FIG. 3B, a method of depositing a ruthenium layer on a substrate according to another embodiment will be described below. At step 310, a substrate is loaded into a reactor. The reactor may be either of the reactors 110a, 110b shown in FIGS. 1A and 1B. A skilled artisan will recognize other suitable reactors that may be used for the method.

Subsequently, at step 320b, a first ruthenium co-precursor pulse is supplied to the reaction space of the reactor to contact the substrate. In the illustrated embodiment, the first ruthenium co-precursor may be triruthenium dodecacarbonyl ($Ru_3(CO)_{12}$). At step 322b, the reactor is purged to remove excess first ruthenium co-precursor and any by-products from the reactor. At step 324b, a second ruthenium co-precursor pulse is supplied to the reaction space of the reactor to contact the substrate. In the illustrated embodiment, the second ruthenium co-precursor may be ruthenium tetraoxide ($RuO_4$). At step 326b, the reactor is purged to remove any excess second ruthenium co-precursor gas and any by-products from the reactor. The steps 320b-326b form a deposition cycle. In other embodiments, a deposition cycle may start with a step of supplying $RuO_4$, which is followed by steps of supplying a purge gas, supplying $Ru_3(CO)_{12}$, and supplying a purge gas. The steps 322b and 326b can be omitted in certain embodiments. Other details of the steps 320b-326b can be as described above with respect to the steps 320a-326a of FIG. 3A.

At step 328b, it is determined whether the number of deposition cycles is equal to a selected number N. The selected number N can be chosen, depending on the desired thickness of the film to be deposited by the method. If the number of deposition cycles is equal to the selected number N, the method proceeds to step 330b. If not, the deposition cycle formed by the steps 320b-326b is further repeated.

At step 330b, a hydrogen gas ($H_2$) pulse is supplied to the reaction space of the reactor to contact the substrate. In one embodiment, the hydrogen gas may be supplied at a flow rate of about 200 sccm to about 3000 sccm, and optionally about 500 sccm to about 1000 sccm. The duration of the step 330b may be between about 1 second and about 20 seconds, and optionally between about 3 seconds and about 7 seconds. The hydrogen gas serves to reduce or prevent ruthenium dioxide ($RuO_2$) from being formed by residual oxygen that may be in the reactor.

At step 332b, the reactor is purged to remove any excess ruthenium co-precursors, hydrogen gas, and/or any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 332b may be between about 0.5 seconds and about 10 seconds, and optionally between about 2 seconds and about 5 seconds. In certain embodiments, the step 332b can be omitted.

Figure 3C:
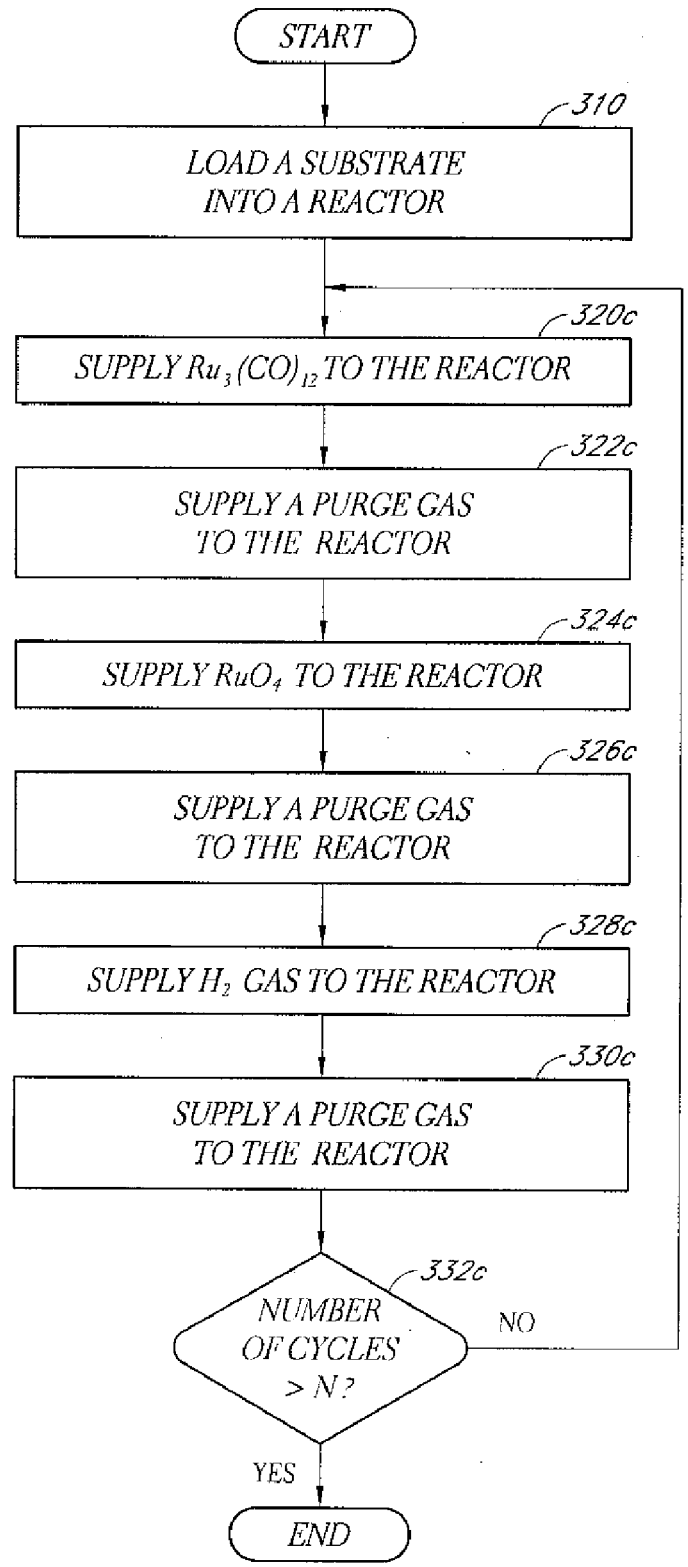
FIG. 3C is a flowchart illustrating a method of forming a ruthenium layer by ALD using ruthenium co-precursors according to yet another embodiment.

Referring to FIG. 3C, a method of depositing a ruthenium layer on a substrate according to yet another embodiment will be described below. At step 310, a substrate is loaded into a reactor. The reactor may be either of the reactors 110a, 110b shown in FIGS. 1A and 1B. A skilled artisan will appreciate that any other suitable reactor may be used for the method.

Subsequently, at step 320c, a first ruthenium co-precursor pulse is supplied to the reaction space of the reactor to contact the substrate. In the illustrated embodiment, the first ruthenium co-precursor may be triruthenium dodecacarbonyl ($Ru_3(CO)_{12}$). At step 322c, the reactor is purged to remove excess first ruthenium co-precursor and any by-products from the reactor. At step 324c, a second ruthenium co-precursor pulse is supplied to the reaction space of the reactor to contact the substrate. In the illustrated embodiment, the second ruthenium co-precursor may be ruthenium tetraoxide ($RuO_4$). At step 326c, the reactor is purged to remove any excess second ruthenium co-precursor gas and any by-products from the reactor. Other details of the steps 320c-326c can be as described above with respect to the steps 320a-326a of FIG. 3A.

At step 328c, a hydrogen gas ($H_2$) pulse is supplied to the reaction space of the reactor to contact the substrate. In one embodiment, the hydrogen gas may be supplied at a flow rate of about 200 sccm to about 3000 sccm, and optionally about 500 sccm to about 1000 sccm. The duration of the step 328c may be between about 1 second and about 20 seconds, and optionally between about 3 seconds and about 7 seconds. The hydrogen gas serves to reduce or prevent ruthenium dioxide ($RuO_2$) from being formed by residual oxygen that may be in the reactor.

At step 330c, the reactor is purged to remove any excess ruthenium co-precursors, hydrogen gas, and/or any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 330c may be between about 0.5 seconds and about 10 seconds, and optionally between about 2 seconds and about 5 seconds. In certain embodiments, the step 330c can be omitted.

The steps 320c-330e form a deposition cycle. In other embodiments, a deposition cycle may start with a step of supplying $RuO_4$, which is followed by steps of supplying a purge gas, supplying $Ru_3(CO)_{12}$, supplying a purge gas, supplying hydrogen gas, and supplying a purge gas. During the deposition cycle, the temperature of the reactor may be maintained at about 100° C. to about 250° C., and optionally about 150° C. to about 200° C.

At step 332c, it is determined whether the number of deposition cycles is equal to a selected number N. The selected number N can be chosen, depending on the desired thickness of the film to be deposited by the method. If the number of deposition cycles is equal to the selected number N, the method is terminated. If not, the deposition cycle formed by the steps 320c-330c is further repeated.

Deposition of Ru Using a Reducing Agent and $RuO_4$

In yet other embodiments, methods for forming ruthenium include adsorbing a reducing agent on a substrate, and supplying $RuO_4$ to be reduced to Ru by the adsorbed reducing agent. In some embodiments, the reducing agent may include one or more of ammonia ($NH_3$), hydrogen gas ($H_2$), and hydrazine ($N_2H_4$). The methods may use chemical vapor deposition or atomic layer deposition to deposit ruthenium on the adsorbed reducing agent.

Figure 4A:
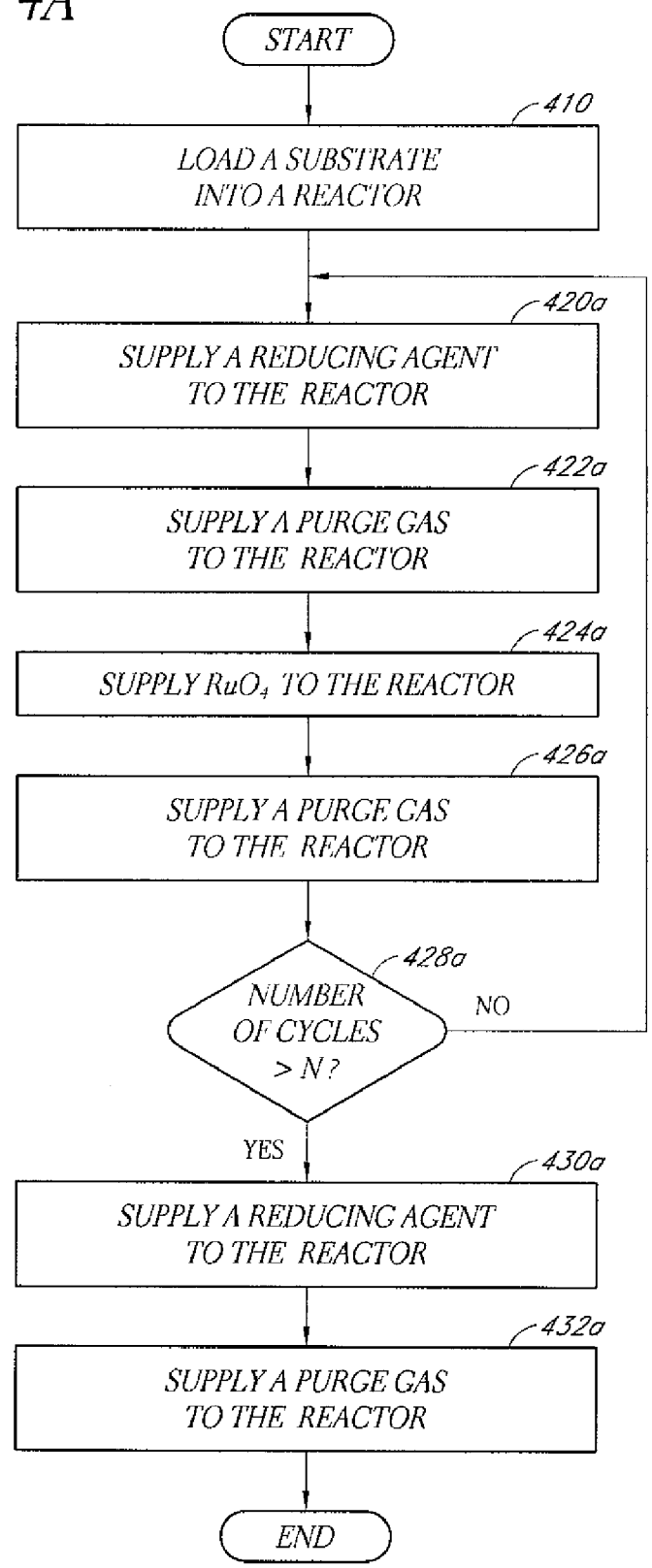
FIG. 4A is a flowchart illustrating a method of forming a ruthenium layer by ALD according to yet another embodiment.

Referring to FIG. 4A, a method of depositing a ruthenium layer on a substrate according to another embodiment will be described below. At step 410, a substrate is loaded into a reactor. The reactor may be either of the reactors 110a, 110b shown in FIGS. 1A and 1B. A skilled artisan will recognize other suitable reactors that may be used for the method.

Subsequently, at step 420a, a reducing agent gas pulse is supplied to the reaction space of the reactor to contact the substrate. The reducing agent may include, for example, one or more of ammonia ($NH_3$), hydrogen gas ($H_2$), and hydrazine ($N_2H_4$). In one embodiment, the reducing agent gas may be supplied at a flow rate of about 200 sccm to about 3000 sccm, and optionally about 500 sccm to about 1000 sccm. The duration of the step 420a may be between about 1 second and about 20 seconds, and optionally between about 3 seconds and about 7 seconds. At least a portion of the reducing agent gas is adsorbed on a surface of the substrate.

At step 422a, the reactor is purged to remove excess reducing agent and any by-products from the reactor. Other details of the steps 422a can be as described above with respect to the step 322a of FIG. 3A.

At step 424a, a ruthenium precursor pulse is supplied to the reaction space of the reactor to contact the substrate. In the illustrated embodiment, the ruthenium precursor may be ruthenium tetraoxide ($RuO_4$). Other details of the steps 424a can be as described above with respect to the steps 324a of FIG. 3A.

At step 426a, the reactor is purged to remove any excess ruthenium precursor and any by-products from the reactor. Other details of the steps 426a can be as described above with respect to the steps 326a of FIG. 3A. The steps 420a-426a form a deposition cycle. In other embodiments, a deposition cycle may start with a step of supplying $RuO_4$, which is followed by steps of supplying a purge gas, supplying a reducing agent, and supplying a purge gas. During the deposition cycle, the temperature of the reactor may be maintained at about 100° C. to about 250° C., and optionally about 150° C. to about 200° C.

At step 428b, it is determined whether the number of deposition cycles is equal to a selected number N. The selected number N can be chosen, depending on the desired thickness of the film to be deposited by the method. If the number of deposition cycles is equal to the selected number N, the method proceeds to step 430a. If not, the deposition cycle formed by the steps 420a-426a is further repeated.

At step 430a, after a desired thickness has been deposited, another reducing agent gas pulse is supplied to the reaction space of the reactor to contact the substrate and to reduce any remaining $RuO_4$ on the substrate. The reducing agent may include, for example, one or more of ammonia ($NH_3$), hydrogen gas ($H_2$), and hydrazine ($N_2H_4$). In one embodiment, the reducing agent gas may be supplied at a flow rate of about 200 sccm to about 3000 sccm, and optionally about 500 sccm to about 1000 sccm. The duration of the step 430a may be between about 1 second and about 20 seconds, and optionally between about 3 seconds and about 7 seconds.

At step 432a, the reactor is purged to remove any excess ruthenium precursor, reducing agent, and any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 432a may be between about 0.5 seconds and about 10 seconds, and optionally between about 2 seconds and about 5 seconds. In certain embodiments, the step 432a can be omitted.

In Examples 1 and 2, ruthenium layers were deposited using the method shown in FIG. 4A. In the Examples, hydrogen gas was used as a reducing agent at the steps 420a and 430a. The compositions of the resulting ruthenium layers were measured by Rutherford backscattering spectrometry (RBS), and are shown in Table 1 below.

TABLE 1

| | Ru (%) | F (%) | O (%) | N (%) | C (%) | H (%) | Thickness (Å) |
|---|---|---|---|---|---|---|---|
| Example 1 | 96 | 2.6 | 0* | 0* | 0* | 2 | 350 |
| Example 2 | 96 | 2.8 | 0* | 0* | 0* | 2 | 380 |

Measurement error on Ru, C, and H was ±1%, and measurement error on O, N, and F was ±2%. In the measurement of the compositions, the detection limits of the elements were 1% for oxygen (O), 2% for nitrogen (N); and 0.5% for carbon (C). The results in Table 1 show that oxygen in the resulting layers was below the detection limit.

Figure 4B:
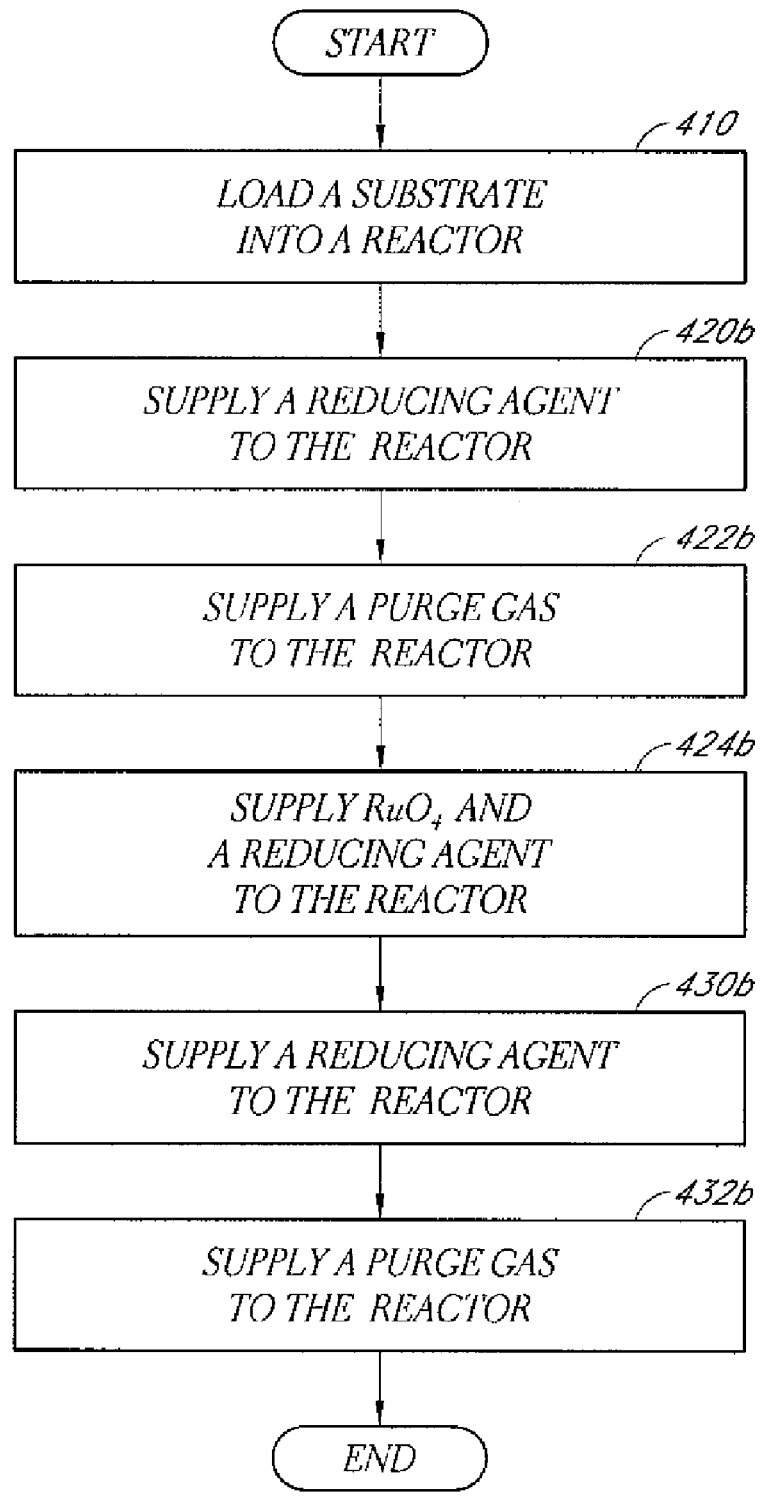
FIG. 4B is a flowchart illustrating a method of forming a ruthenium layer by CVD according to another embodiment.

Referring to FIG. 4B, a method of depositing a ruthenium layer on a substrate according to another embodiment will be described below. At step 410, a substrate is loaded into a reactor. The reactor may be either of the reactors 110a, 110b shown in FIGS. 1A and 1B. A skilled artisan will recognize other suitable reactors that may be used for the method.

Subsequently, at step 420b, a reducing agent gas is supplied to the reaction space of the reactor to contact the substrate. The reducing agent may include, for example, one or more of ammonia ($NH_3$), hydrogen gas ($H_2$), and hydrazine ($N_2H_4$). In one embodiment, the reducing agent gas may be supplied at a flow rate of about 200 sccm to about 3000 sccm, and optionally about 500 sccm to about 1000 sccm. The duration of the step 420b may be between about 1 second and about 20 seconds, and optionally between about 3 seconds and about 7 seconds. At least a portion of the reducing agent gas is adsorbed on a surface of the substrate.

At step 422b, the reactor is purged to remove excess reducing agent and any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 422b may be between about 0.5 seconds and about 10 seconds, and optionally between about 2 seconds and about 5 seconds. In certain embodiments, the step 422b can be omitted.

At step 424a, a ruthenium layer may be formed by chemical vapor deposition (CVD). In the illustrated embodiment, ruthenium tetraoxide ($RuO_4$) and a reducing agent are simultaneously supplied to the reaction space of the reactor to contact the substrate. The reducing agent may include, for example, one or more of ammonia ($NH_3$), hydrogen gas ($H_2$), and hydrazine ($N_2H_4$).

In one embodiment, the ruthenium tetraoxide may be supplied at a flow rate of about 20 sccm to about 500 sccm, and optionally about 50 sccm to about 100 sccm. The reducing agent may be supplied at a flow rate of about 200 sccm to about 3000 sccm, and optionally about 500 sccm to about 1000 sccm. The duration of the step 424b can vary widely, depending on the thickness of the deposited ruthenium layer. The temperature of the reactor may be maintained at about 100° C. to about 250° C., and optionally about 150° C. to about 200° C.

At step 430b, a reducing agent is supplied to the reaction space of the reactor to contact, the substrate, thereby reducing any remaining $RuO_4$ on the substrate. The reducing agent may include, for example, one or more of ammonia ($NH_3$), hydrogen gas ($H_2$), and hydrazine ($N_2H_4$). Other details of the step 430b can be as described above with respect to the step 430a of FIG. 4A.

At step 432b, the reactor is purged to remove any excess ruthenium precursor, reducing agent, and any by-products from the reactor. Other details of the step 432b can be as described above with respect to the step 432a of FIG. 4A.

Deposition of Ruthenium Dioxide

In the embodiments described above, the formation of ruthenium, rather than ruthenium dioxide, is desired. In some instances, however, a ruthenium dioxide ($RuO_2$) film may need to be formed. In order to deposit ruthenium dioxide, a process facilitating autocatalytic deposition of ruthenium tetraoxide ($RuO_4$) may be used. In one embodiment, the process may use a relatively high reactor pressure of, for example, about 10 torr to about 30 torr. The method may also include providing an initial seed layer formed of, for example, an organic compound.

Figure 5A:
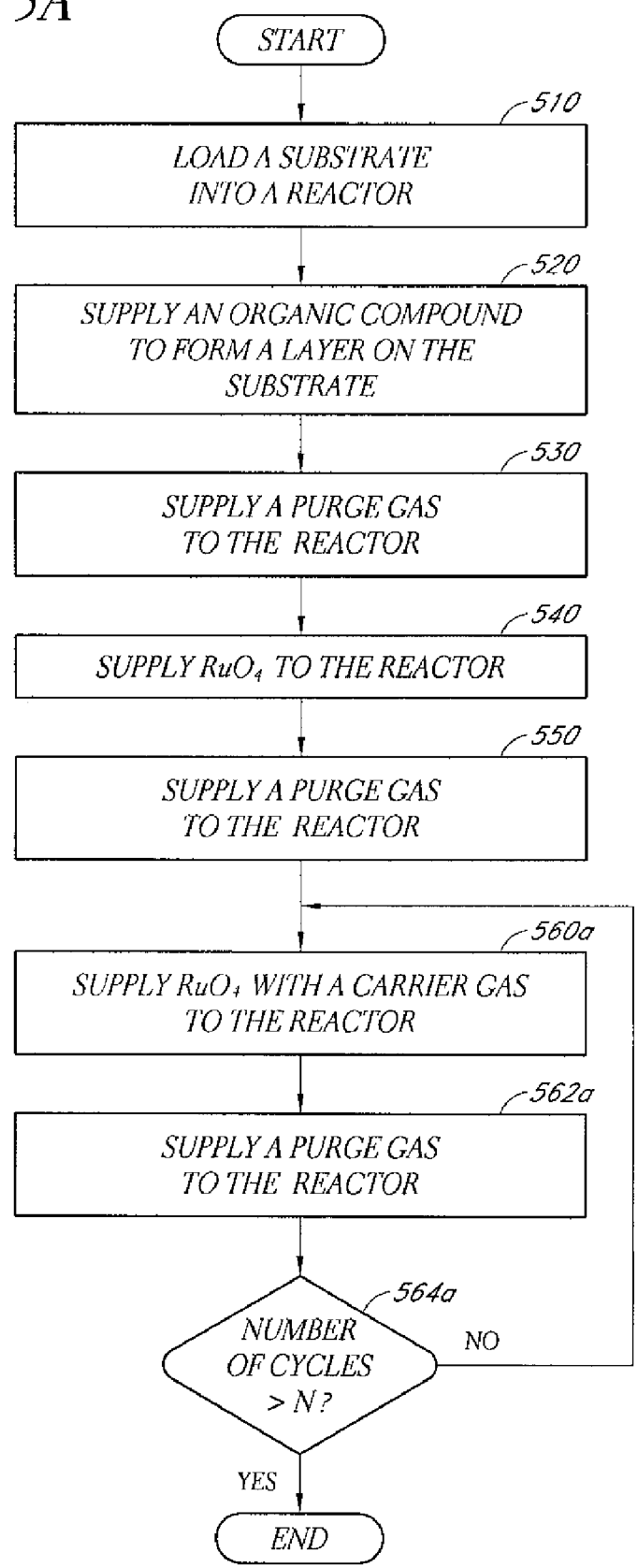
FIG. 5A is a flowchart illustrating a method of forming a ruthenium dioxide layer by ALD according to one embodiment.

Referring to FIG. 5A, a method of depositing a ruthenium dioxide layer on a substrate according to one embodiment will be described below. At step 510, a substrate is loaded into a reactor. The reactor may be either of the reactors 110a, 110b shown in FIGS. 1A and 1B. A skilled artisan will recognize other reactors that may be used for the method. In one embodiment, the temperature of the reactor may be maintained at about 100° C. to about 250° C., and optionally about 150° C. to about 220° C. In addition, the pressure of the reactor may be maintained at, for example, about 10 torr to about 30 torr.

Subsequently, at step 520, an organic compound pulse may be supplied to the reaction space of the reactor to contact the substrate, thereby forming a layer on the substrate. The layer may be a monolayer or may include multiple sublayers. Examples of the organic compounds include, but are not limited to, alkane, alkene, and alkyne compounds, and derivatives of the foregoing. Another example of the organic compound is alcohol, such as ethanol. The duration of the step 520 may be between about 0.2 seconds and about 5 seconds, and optionally between about 0.5 seconds and about 2 seconds.

At step 530, the reactor is purged to remove excess organic compound and any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 530 may be between about 0.2 seconds and about 5 seconds, and optionally between about 0.5 seconds and about 2 seconds. In certain embodiments, the step 530 can be omitted.

At step 540, a ruthenium tetraoxide gas pulse is supplied to the reaction space of the reactor to contact the substrate. In one embodiment, the ruthenium tetraoxide may be supplied at a flow rate of about 20 sccm to about 500 sccm, and optionally about 50 sccm to about 100. The duration of the step 540 may be between about 0.5 seconds and about 5 seconds, and optionally between about 1 second and about 3 seconds. The ruthenium tetraoxide supplied during this step may react with the organic compound, and oxidize it to, for example, $CO_2$ or $H_2O$, thereby forming ruthenium dioxide, which forms a seed layer for subsequent ruthenium dioxide formed thereon.

At step 550, the reactor is purged to remove excess $RuO_4$ and any by-products from the reactor. In one embodiment, an inert purge gas is supplied to the reactor at a flow rate of about 50 sccm to about 1000 sccm, and optionally about 100 sccm to about 500 sccm. Examples of inert purge gases include, but are not limited to, argon (Ar), helium (He), and nitrogen gas ($N_2$). The duration of the step 550 may be between about 0.2 seconds and about 5 seconds, and optionally between about 0.5 seconds and about 3 seconds.

In another embodiment, the step 550 can be omitted. In yet another embodiment, a supply of $RuO_4$ to the reaction space is continued in the step 540 until a layer having a desired thickness is deposited, omitting the steps 550, 560a, and 562a. In certain embodiments, the steps 540 and 550 can be repeated until a layer having a desired thickness is deposited, omitting the steps 560a, and 562a.

At step 560a, a ruthenium dioxide layer may be formed on the seed layer. In the illustrated embodiment, a ruthenium tetraoxide gas pulse is supplied to the reaction space of the reactor to contact the substrate, along with a non-reducing carrier gas. In the context of this document, the term "non-reducing carrier gas" refers to a gas that can carry ruthenium tetraoxide without reducing ruthenium tetraoxide. Examples of non-reducing gases include, but are not limited to, nitrogen gas ($N_2$), and argon gas (Ar). This step converts the ruthenium tetraoxide into ruthenium dioxide through autocatalytic decomposition. In one embodiment, the ruthenium tetraoxide may be supplied at a flow rate of about 20 sccm to about 500 sccm, and optionally about 50 sccm to about 100 sccm. The duration of the step 560 may be between about 0.5 seconds and about 5 seconds, and optionally between about 1 second and about 3 seconds.

At step 562a, the reactor is purged to remove excess $RuO_4$ and any by-products from the reactor. In one embodiment, an inert purge gas is supplied to the reactor at a flow rate of about 50 sccm to about 1000 sccm, and optionally about 100 sccm to about 500. Examples of inert purge gases include, but are not limited to, argon (Ar), helium (He), and nitrogen gas ($N_2$). The duration of the step 562a may be between about 0.2 seconds and about 5 seconds, and optionally between about 1 second and about 3 seconds. In certain embodiments, the step 562a can be omitted. The steps 560a and 562a may form a single deposition cycle.

At step 564a, it is determined whether the number of deposition cycles is equal to, a selected number N. The selected number N can be chosen, depending on the desired thickness of the film to be deposited by the method. If the number of deposition cycles is equal to the selected number N, the method is terminated. If not, the deposition cycle formed by the steps 560a and 562a is further repeated.

Figure 5B:
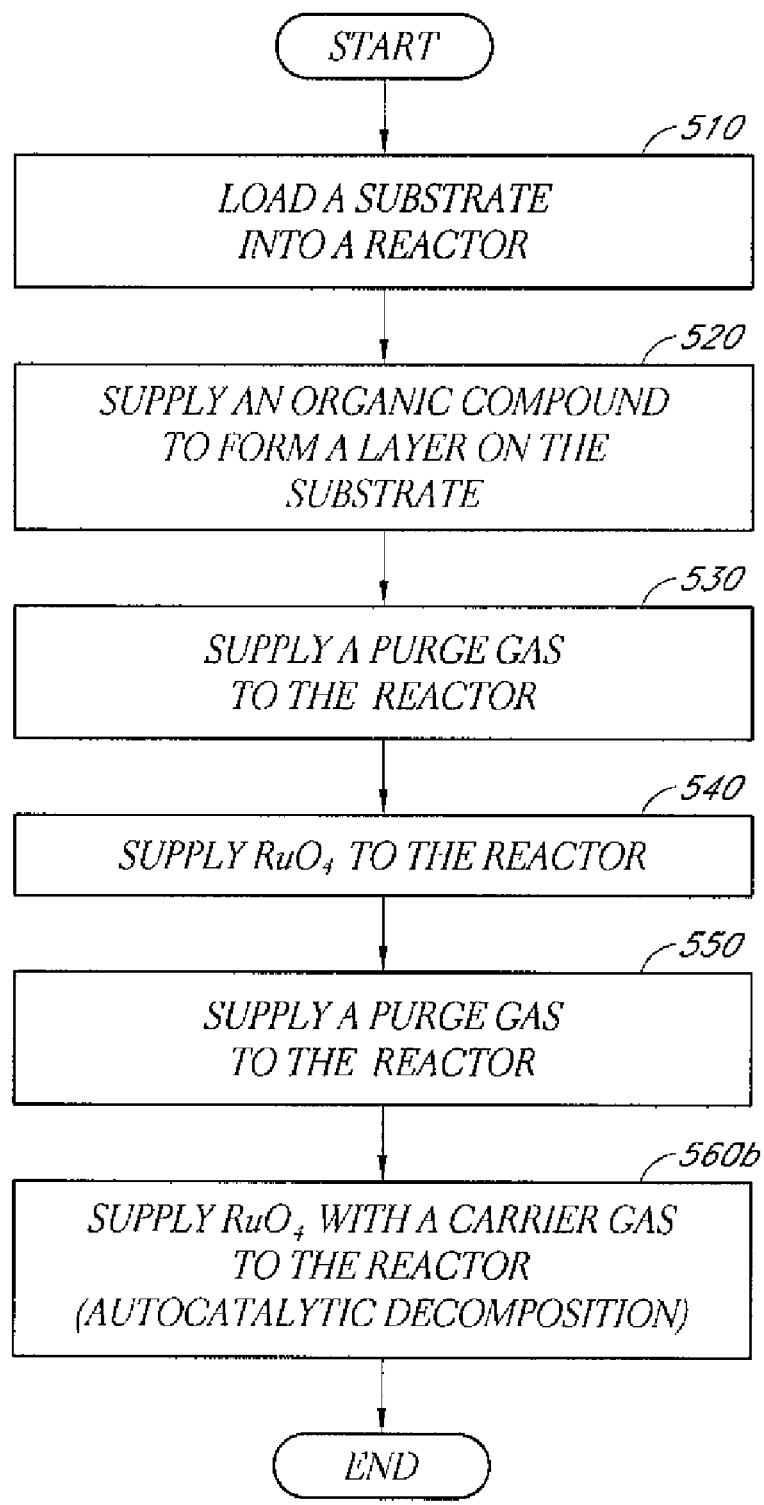
FIG. 5B is a flowchart illustrating a method of fanning a ruthenium dioxide layer by CVD according to another embodiment.

Referring to FIG. 5B, a method of depositing a ruthenium dioxide layer on a substrate according to another embodiment will be described below. At step 510, a substrate is loaded into a reactor. Subsequently, at step 520, an organic compound pulse may be supplied to the reaction space of the reactor to contact the substrate, forming a layer on the substrate. Organic compounds may be as described above. At step 530, the reactor is purged to remove excess organic compound and any by-products from the reactor. At step 540, a ruthenium tetraoxide gas pulse is supplied to the reaction space of the reactor to contact the substrate. At step 550, the reactor is purged to remove excess organic compound and any by-products from the reactor. Details of the steps 510-550 can be as described above in connection with the steps 510-550 of FIG. 5A.

At step 560b, a ruthenium tetraoxide gas pulse is supplied to the reaction space of the reactor to contact the substrate along with a non-reducing carrier gas. Examples of non-reducing gases include, but are not limited to, nitrogen gas ($N_2$), and argon gas (Ar). Chemical vapor deposition is caused during this step. This step converts the ruthenium tetraoxide into ruthenium dioxide through autocatalytic decomposition. In one embodiment, the ruthenium tetraoxide gas may be supplied at a flow rate of about 20 sccm to about 500 sccm, and optionally about 50 sccm to about 100 sccm. The duration of the step 560b is decided by the thickness of the film. In another embodiment, a supply of $RuO_4$ to the reaction space is continued in the step 540 until a layer having a desired thickness is deposited, omitting the steps 550 and 560b.

Electronic Devices Using Ruthenium or Ruthenium Dioxide

As described above, ruthenium and ruthenium dioxide have many desired properties, and thus have many possible applications. In certain instances, ruthenium or ruthenium dioxide may be used for electrodes for integrated circuits, for example, DRAMs and CMOS transistors. Ruthenium may be also used as an adhesion layer for attaching a certain metal, e.g., Ta, to copper. Such a metal may be used as a copper diffusion barrier. In addition, ruthenium nanocrystal may be used as a charge storage layer for a flash memory device. Further, ruthenium may be used as a head isolation layer in a magnetic head because of its non-magnetic properties and low diffusion into a magnetic layer.

The embodiments of the deposition process described above may be used for forming ruthenium or ruthenium dioxide films that can be part of various electronic devices. Examples of the electronic device include, but are not limited to, consumer electronic products, electronic circuits, electronic circuit components, parts of the consumer electronic products, electronic test equipments, etc. The consumer electronic products may include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device may include unfinished or partially fabricated products.

In at least some of the aforesaid embodiments, any element used in an embodiment can interchangeably be used in another embodiment unless such a replacement is not feasible. It will be appreciated by those skilled in the art that various other omissions, additions and modifications may be made to the methods and structures described above without departing from the scope of the invention. All such modifications and changes are intended to fall within the scope of the invention, as defined by the appended claims.

I claim:

1. A method of depositing a ruthenium layer over a substrate, the method comprising:
   supplying triruthenium dodecacarbonyl over a surface of a substrate to form a seed layer over the surface of the substrate; and
   conducting deposition over the seed layer, wherein the deposition comprises: supplying ruthenium tetraoxide over the seed layer.

2. The method of claim 1, wherein the deposition further comprises supplying a reducing agent over the seed layer.

3. The method of claim 2, wherein the reducing agent comprises at least one selected from the group consisting of $NH_3$, $H_2$, and $N_2H_4$.

4. The method of claim 2, wherein the deposition comprises supplying the ruthenium tetraoxide over the seed layer simultaneously with supplying the reducing agent.

5. The method of claim 2, wherein the deposition comprises conducting at least one deposition cycle, which comprises:
   supplying the ruthenium tetraoxide over the seed layer without supplying a reducing agent during a first time period; and
   supplying the reducing agent over the seed layer without supplying ruthenium tetraoxide during a second time period after the first time period.

6. The method of claim 5, wherein the at least one deposition cycle further comprises supplying a purge gas over the seed layer between the first and second time periods.

7. The method of claim 5, wherein the at least one deposition cycle further comprises supplying a purge gas over the seed layer after the second time period.

8. A method for forming a ruthenium thin film on a substrate, the method comprising:
   loading a substrate into a reactor; and
   conducting a plurality of deposition cycles on the substrate, at least one of the cycles comprising:
      supplying triruthenium dodecacarbonyl to the reactor during a first time period; and
      supplying ruthenium tetraoxide to the reactor during a second time period between the first time period and an immediately subsequent deposition cycle.

9. The method of claim 8, wherein the at least one of the cycles further comprises supplying a purge gas to the reactor between the first time period and the second time period.

10. The method of claim 8, wherein the at least one of the cycles further comprises supplying a purge gas to the reactor between the second time period and the immediately subsequent deposition cycle.

11. The method of claim 8, further comprising supplying hydrogen gas to the reactor after conducting the plurality of deposition cycles.

12. The method of claim 11, further comprising supplying a purge gas to the reactor after supplying the hydrogen gas.

13. The method of claim 8, wherein the at least one of the cycles further comprises supplying hydrogen gas to the reactor during a third time period between the second time period and the immediately subsequent deposition cycle.

14. The method of claim 13, wherein the at least one of the cycles further comprise supplying a purge gas to the reactor between the third time period and the immediately subsequent deposition cycle.

15. A method for forming a ruthenium thin film on a substrate, the method comprising:
   loading a substrate including a surface into a reactor;
   supplying a reducing agent to the reactor during a first time period such that at least a portion of the reducing agent is adsorbed on the surface of the substrate;
   supplying ruthenium tetraoxide to the reactor during a second time period after the first time period; and
   supplying a reducing agent to the reactor during a third time period after the second time period.

16. The method of claim 15, further comprising supplying a purge gas to the reactor between the first and second time periods.

17. The method of claim 15, further comprising supplying a purge gas to the reactor after the third time period.

18. The method of claim 15, further comprising supplying a reducing agent to the reactor simultaneously with supplying the ruthenium tetraoxide to the reactor during the second time period.

19. The method of claim 15, wherein supplying the ruthenium tetraoxide to the reactor during the second time period comprises supplying the ruthenium tetraoxide to the reactor without supplying a reducing agent to the reactor.

20. The method of claim 19, further comprising supplying a purge gas to the reactor between the second and third time periods.

21. The method of claim 15, further comprising conducting at least one deposition cycle between the second and third time periods, wherein the at least one deposition cycle comprises:
   supplying a reducing agent to the reactor without supplying ruthenium tetraoxide during a fourth time period; and
   supplying ruthenium tetraoxide to the reactor without supplying a reducing agent during a fifth time period.

22. The method of claim 21, wherein the fourth time period has substantially the same duration as the first time period, and wherein the fifth time period has substantially the same duration as the second time period.

23. The method of claim 21, wherein the reducing agent supplied during the fourth time period comprises at least one selected from the group consisting of $NH_3$, $H_2$, and $N_2H_4$.

24. The method of claim 15, wherein the reducing agent supplied during the first or third time period comprises at least one selected from the group consisting of $NH_3$, $H_2$, and $N_2H_4$.

25. A method for forming a ruthenium dioxide thin film on a substrate, the method comprising:

loading a substrate including a surface into a reactor;

supplying an organic compound to the reactor during a first time period such that a layer of the organic compound is formed on the surface of the substrate; and supplying ruthenium tetraoxide to the reactor during a second time period after the first time period.

26. The method of claim 25, further comprising supplying a purge gas to the reactor between the first and second time periods.

27. The method of claim 25, further comprising supplying ruthenium tetraoxide and a non-reducing gas to the reactor during a third time period after the second time period.

28. The method of claim 27, further comprising supplying a purge gas to the reactor between the second and third time periods.

29. The method of claim 27, further comprising supplying a purge gas to the reactor after the third time period.

30. The method of claim 27, further comprising conducting at least one deposition cycle after the third time period, wherein the at least one deposition cycle comprises:

supplying ruthenium tetraoxide and a non-reducing gas to the reactor during a fourth time period; and supplying a purge gas to the reactor during a fifth time period after the fourth time period.

31. The method of claim 30, wherein the fourth time period has substantially the same duration as the third time period.

32. The method of claim 27, wherein the non-reducing gas comprises at least one selected from the group consisting of $N_2$, $O_2$, and Ar.

33. The method of claim 25, wherein the organic compound comprises at least one selected from the group consisting of alkane, alkene, and alkyne compounds, and derivatives of the foregoing.

* * * * *